United States Patent [19]
Sato et al.

[11] Patent Number: 5,546,352
[45] Date of Patent: Aug. 13, 1996

[54] SEMICONDUCTOR MEMORY DEVICE HAVING DECODER

[75] Inventors: Hirotoshi Sato; Tomohisa Wada, both of Hyogo, Japan

[73] Assignee: Mitsubishi Denki Kabushiki Kaisha, Tokyo, Japan

[21] Appl. No.: 354,760

[22] Filed: Dec. 12, 1994

[30] Foreign Application Priority Data

Dec. 28, 1993 [JP] Japan ................................. 5-336936

[51] Int. Cl.⁶ ........................................................ G11C 8/00
[52] U.S. Cl. ................. 365/230.06; 365/233; 365/230.08
[58] Field of Search ........................... 365/233, 230.06, 365/230.08, 189.05, 189.07

[56] References Cited

U.S. PATENT DOCUMENTS 5,054,002  10/1991  Ninomiya et al. .................. 365/233
5,327,390   7/1994  Takasugi ......................... 365/230.06

FOREIGN PATENT DOCUMENTS 6358696    3/1983  Japan .
60-93696   5/1985  Japan .
62-250583 10/1987  Japan .
1-58591   12/1989  Japan .
2-137189   5/1990  Japan .

*Primary Examiner*—Joseph A. Popek
*Attorney, Agent, or Firm*—Lowe, Price, LeBlanc & Becker

[57] ABSTRACT

In the present invention, a row address processing circuit and a column address processing circuit operate in synchronism with an externally applied synchronous signal in a semiconductor memory device. The row address processing circuit and the column address processing circuit each include an address buffer and a decoder. The address buffer or decoder operates in synchronism with the synchronous signal.

23 Claims, 18 Drawing Sheets

5,546,352

SEMICONDUCTOR MEMORY DEVICE HAVING DECODER

BACKGROUND OF THE INVENTION

1. Field of the Invention

The present invention generally relates to semiconductor memory devices, and more particularly, to a semiconductor memory device including a circuit receiving an input signal and decoding the input signal.

2. Description of the Background Art

FIG. 23 is a block diagram showing a configuration of a conventional synchronous static random access memory (hereinafter referred to as a synchronous SRAM).

The synchronous SRAM includes a memory cell array 7, a row address buffer 202, a latch circuit 211, a row address decoder 203, a column address buffer 205, a latch circuit 212, a column address decoder 206, a multiplexer 8, a read/write circuit 9, a data input/output buffer/latch circuit 10, and a read/write control circuit 16.

In memory cell array 7, memory cells storing information are arranged in a matrix manner. Row address buffer 202 and latch circuit 211 receive an externally applied row address signal RADD, and amplifies, and inverts and amplifies row address signal RADD for holding. Row address decoder 203 decodes the row address signal applied from latch circuit 211.

Column address buffer 205 and latch circuit 212 amplifies, and inverts and amplifies an externally applied column address signal CADD for holding. Column address decoder 206 decodes the column address signal applied from latch circuit 212.

In response to an output signal from column address decoder 206, multiplexer 8 provides write data applied from read/write circuit 9 to memory cell array 7, and provides read data from memory cell array 7 to read/write circuit 9.

Read/write circuit 9 includes a sense amplifier for reading which senses and amplifies a read voltage of a small amplitude, and a write buffer for writing. Data input/output buffer/latch circuit 210 includes an output data buffer for amplifying and holding an output from the sense amplifier of read/write circuit 9, and an input data buffer for amplifying and holding an externally applied signal indicating write data WD.

Data input/output buffer/latch circuit 210 amplifies a signal, applied from read/write circuit 9, indicating read data and provides the amplified signal to the outside world, and amplifies an externally applied signal indicating write data and provides the amplified signal to read/write circuit 9. Read/write control circuit 16 receives a chip enable signal CE and a write enable signal WE, and controls read/write circuit 9 and data input/output buffer/latch circuit 210 in response to these signals.

FIG. 24 is a block diagram showing a detailed configuration of a peripheral portion of memory cell array 7 of the synchronous SRAM shown in FIG. 23. In this figure, for simplicity of description, the case where memory cells of memory cell array 7 are arranged in two rows and two columns is described.

Referring to FIG. 24, in memory cell array 7, memory cells 224a, 224b, 224c, 224d are arranged at respective crossing points of word lines 222 and 223 connected to row address decoder 203 and bit line pairs 220a, 220b, and 221a, 221b.

Bit line loads 225a, 225b, 226a, 226b are connected between a power supply node 90 receiving a power supply potential and bit lines 220a, 220b, 221a, 221b.

An I/O line pair 229a, 229b is connected to read/write circuit 9. Transfer gates 227a, 228a are connected between bit lines 220a and 221a, and I/O line 229a, respectively. Transfer gates 227a, 228a each receive an output signal from column address decoder 206 at its gate.

Transfer gates 227b, 228b are connected between bit lines 220b and 221b, and I/O line 229b, respectively. Transfer gates 227b and 228b each receive an output signal from column address decoder 206 at its gate.

Read/write circuit 9 amplifies a potential difference between I/O lines 229a, 229b, and provides the amplified signal to data input/output buffer/latch circuit 210. Data input/output buffer/latch circuit 210 amplifies an output signal from read/write circuit 9 and provides the amplified signal as read data RD.

When memory cell 224a is selected, for example, the following operation is carried out. In response to a row address signal applied to row address decoder 203, word line 222 to which memory cell 224a is connected is brought to a selected level (for example, an H level), and another word line 223 is brought to a non-selected level (for example, an L level).

In response to a column address signal applied to column address decoder 206, transfer gates 227a, 227b corresponding to bit line pair 220a, 220b to which memory cell 224a is connected are rendered conductive.

As a result, bit line pair 220a, 220b is connected to I/O line pair 229a, 229b, and another bit line pair 221a, 221b is disconnected from I/O line pair 229a, 229b.

In reading data, write enable signal WE applied to read/write circuit 9 through read/write control circuit 16 is brought to the L level, and I/O line pair 229a, 229b is disconnected from a data input terminal 12. In this case, chip enable signal CE applied to read/write circuit 9 through read/write control circuit 16 is brought to the H level, and the sense amplifier of read/write circuit 9 is brought to an operating state.

Word line 222 or 223 is selected by row address decoder 203, and all the memory cells connected to the selected word line are activated. At the same time, bit line pair 220a, 220b or 221a, 221b is selected by column address decoder 206. As a result, data is read out to I/O line pair 229a, 229b from a memory cell selected by the word line and the bit line pair.

By the data reading, a potential difference generated between I/O lines 229a, 229b is amplified by the sense amplifier of read/write circuit 9, and the amplified signal is applied to data input/output buffer/latch circuit 210.

FIG. 25 is a circuit diagram showing one example of a configuration of latch circuit 211.

Referring to FIG. 25, the latch circuit includes an NMOS transistor 231 and inverters 233, 235 and 237. In this latch circuit, an input terminal 230 receives an output signal from row address buffer 202, and NMOS transistor 231 receives a synchronous signal CLK. An output signal is provided from an output terminal 236 to row address decoder 203 of FIG. 23.

When synchronous signal CLK is at the H level, a signal applied through input terminal 230 is applied to output terminal 236 through NMOS transistor 231, inverters 233 and 235, and latched by inverters 233 and 237. On the other hand, when synchronous signal CLK is at the L level, the signal latched by inverters 233 and 237 is applied to output terminal 236 through inverter 235.

Another example of latch circuit 211 of FIG. 23 will now be described. FIG. 26 is a circuit diagram showing another example of the configuration of latch circuit 211. The latch circuit of FIG. 26 includes two stages of latch circuits shown in FIG. 25 connected in series.

Referring to FIG. 26, the latch circuit includes NMOS transistors 241 and 248, and inverters 243, 245, 247, 250, 252 and 254.

An input terminal 240 receives an output signal from row address buffer 202. NMOS transistor 241 receives synchronous signal CLK at its gate. NMOS transistor 248 receives an inverted synchronous signal /CLK ("/" indicates an inverted signal hereinafter) which is an inverted signal of synchronous signal CLK at its gate. An output terminal 253 provides an output signal to row address decoder 203 of FIG. 23.

When synchronous signal CLK is at the H level, NMOS transistor 241 is rendered conductive. Therefore, a signal applied through input terminal 240 is transmitted to a node 246 between inverter 245 and NMOS transistor 248 through NMOS transistor 241, and inverters 243 and 245. Simultaneously, the signal is latched by inverters 243 and 247.

When inverted synchronous signal /CLK attains the H level, NMOS transistor 248 is rendered conductive. Therefore, the signal transmitted to node 246 is transmitted to an output terminal 253 through NMOS transistor 248, and inverters 250 and 252. Simultaneously, the signal is latched by inverters 250 and 254.

More specifically, when synchronous signal CLK is at the H level, a signal is latched by inverters 243 and 247. When inverted synchronous signal /CLK attains the H level, the latched signal is latched by inverters 250 and 254, and transmitted to output terminal 253.

Description will now be given of timings of address selection operation in the SRAM of FIG. 23 with reference to a timing chart shown in FIG. 27.

In FIG. 27, shown are synchronous signal CLK, a predecode signal PDO provided from row address buffer 202, a latch output signal LO provided from latch circuit 211, a subdecoder output signal SDO in row address decoder 203, and a word line select signal WL. Subdecoder output signal SDO is an output signal from a subdecoder included in row address decoder 203.

Referring to FIG. 27, when a word line is selected, row address signal RADD corresponding to a word line to be selected is applied to row address buffer 202. In row address buffer 202, applied row address signal RADD is amplified, inverted and amplified, and predecoded. Applied row address signal RADD is converted into an internal signal, and provided as predecode signal PDO which is an internal signal. Predecode signal PDO is latched in response to synchronous signal CLK in latch circuit 211, and transmitted to row address decoder 203.

In row address decoder 203, in response to latch output signal LO provided from latch circuit 211, subdecoder output signal SDO changes, and, in response to this, line select signal WL changes.

In row address decoder 203, timings of selection and non-selection of a word line are so set that both have approximately the same delay time from change of row address signal RADD. More specifically, selection and non-selection of a word line are carried out at the same timing. A particular word line is brought to a selected level in response to word line select signal WL in row address decoder 203, and the other word lines are brought to a non-selected level.

Similarly, a bit line pair is selected. In this case, a column address signal corresponding to a bit line pair to be selected is applied to column address buffer 205.

In response to application of the column address signal, only a pair of transfer gates connected to the bit line pair to be selected is rendered conductive. Only the selected bit line pair is connected to I/O line pair 229a, 229b, and the other bit line pairs are disconnected from the I/O line pair.

In selection of a bit line pair, similar to the case of selection of a word line, timings of selection and non-selection are so set that both have approximately the same delay time from change of column address signal CADD.

As described above, in the conventional synchronous SRAM, in order to synchronize operation with synchronous signal CLK, latch circuit 211 was provided between row address buffer 202 and row address decoder 203, and latch circuit 212 was provided between column address buffer 205 and column address decoder 206.

Therefore, an address signal is strobed and latched only at a timing where synchronous signal CLK is in an active state, and the latched address signal is transmitted to an address decoder. Therefore, any word line and bit line pair are always selected.

Row address decoder 203 and column address decoder 206 were the same in timings of selection and non-selection of a word line or a bit line pair.

In the conventional synchronous SRAM, however, any word line or bit line pair is always selected. If the timing of selection and the timing of non-selection are not set equal, multiple selection occurs. Therefore, in order to increase the operation speed, both selection operation and non-selection operation must be carried out at a high speed, resulting in difficulty of increase of the operation speed. This is because, for example, it is necessary to increase in size both a transistor for carrying out selection operation and a transistor for carrying out non-selection operation.

SUMMARY OF THE INVENTION

One object of the present invention is to easily increase an operation speed of a semiconductor memory device.

Another object of the present invention is to easily increase a speed of operation associated with a decode processing of an externally applied address signal in a semiconductor memory device.

Still another object of the present invention is to easily increase a speed of operation of a logic gate included in a decoder of a semiconductor memory device.

A semiconductor memory device according to the present invention receiving an external input signal and a synchronous signal and decoding the external input signal in synchronism with the synchronous signal includes an input processing circuit including a buffer circuit and a decode circuit.

The input processing circuit processes the external input signal in response to the synchronous signal. The buffer circuit included in the input processing circuit amplifies, and inverts and amplifies the external input signal for output. The decode circuit included in the input processing circuit decodes an output signal from the buffer circuit. The buffer circuit or the decode circuit provides a signal in response to the synchronous signal.

As described above, since the buffer circuit or the decode circuit provides a signal in response to the synchronous signal, decoding in synchronism with the synchronous signal can be carried out without using a latch circuit. Therefore, it is not necessary to hold the decode result of the external input signal until the next external input signal changes, and it is not necessary to carry out selection operation and non-selection operation of a word line or the like by decoding at the same timing. Therefore, only the selection operation can be increased in speed.

A semiconductor memory device according to another aspect of the present invention receiving an external input signal and a synchronous signal and decoding the external input signal in synchronism with the synchronous signal includes a phase inverted signal generating circuit, a predecode circuit, and a logic gate circuit.

The phase inverted signal generating circuit receives the external input signal, and provides a signal obtained by amplification, and inversion and amplification of the external input signal. The predecode circuit receives an output signal from the phase inverted signal generating circuit and predecodes the output signal for output.

The logic gate circuit takes a logical product of the output signal from the phase inverted signal generating circuit or an output signal from the predecode circuit and the synchronous signal, and provides the resultant signal as the output signal from the phase inverted signal generating circuit or the predecode circuit.

As described above, since a signal based on a logical product of an output signal from the phase inverted signal generating circuit or an output signal from the predecode circuit and the synchronous signal is provided as an output signal from the phase inverted signal generating circuit or the predecode circuit, decoding in synchronism with the synchronous signal can be carried out without using a latch circuit.

In addition, decoding is carried out only when the synchronous signal is activated. Therefore, it is not necessary to always hold the decode result, and it is not necessary to carry out selection operation and non-selection operation by decoding at the same timing. As a result, only decoding associated with the selection operation can be increased in speed.

A semiconductor memory device according to still another aspect of the present invention receiving an external input signal and a synchronous signal and decoding the external input signal in synchronism with the synchronous signal includes a logic gate circuit including a signal generating node, a transistor circuit, a precharge circuit, a gate circuit, and a potential control circuit.

The logic gate circuit is provided for decoding the external input signal. The logic gate circuit takes a logical sum or a logical product of a plurality of internal signals obtained in response to the external input signal, and provides the resultant output signal.

The signal generating node generates an output signal. The transistor circuit receives the plurality of internal signals, and controls the signal generating node to attain a first potential in response to the internal signals. The precharge signal generating circuit generates a precharge signal in response to the signal generating node attaining the first potential.

The gate circuit receives the plurality of internal signals and the precharge signal. In response to the internal signals, the gate circuit provides the precharge signal when the transistor circuit does not control the signal generating node to attain the first potential. The potential control circuit controls the signal generating node to attain a second potential in response to the precharge signal provided from the gate circuit.

As described above, the transistor circuit controls the potential of the signal generating node to attain the first potential in response to the internal signals. On the other hand, the potential control circuit controlling the potential of the signal generating node to attain the second potential does not directly receive the internal signals, since it controls the potential of the signal generating node in response to the precharge signal. Therefore, by increasing a transistor configuring the transistor circuit in size, only one operation of rising and falling of a level of the output signal can be increased in speed. Therefore, it is easy to increase decode operation in speed.

A semiconductor memory device according to a further aspect of the present invention receiving an external input signal and a synchronous signal and decoding the external input signal in synchronism with the synchronous signal includes a logic gate circuit including a signal generating node, a first transistor circuit, a first potential supply circuit, an output node, a second transistor circuit, and a second potential supply circuit.

The logic gate circuit is provided for decoding the external input signal. The logic gate circuit takes a logical sum or a logical product of a plurality of internal signals obtained in response to the external input signal, and generates the resultant output signal.

The signal generating node generates a control signal. The first transistor circuit receives the plurality of internal signals, and controls the potential of the signal generating node to attain a first level in response to the internal signals. The first potential supply circuit brings the potential of the signal generating node to a second level when the potential of the signal generating node is not controlled to attain the first level.

From the output node, an output signal is provided. The second transistor circuit receives the control signal from the signal generating node, and controls the potential of the output node to attain the second level in response to the control signal. The second potential supply circuit brings the potential of the output node to the first level when the output node is not controlled to attain the second level.

As described above, only the first transistor circuit among circuits changing the potential of the signal generating node receives the internal signals, and controls the potential of the signal generating node. Further, only the second transistor circuit among circuits changing the potential of the output node receives the internal signals, and controls the potential of the output signal.

Therefore, by increasing the second transistor circuit in size, it is possible to increase in speed only one operation of rising and falling of the level of the output signal.

A semiconductor memory device according to a further aspect of the present invention receiving an external input signal and a synchronous signal and decoding the external input signal in synchronism with the synchronous signal includes a logic gate circuit including a signal generating node, a first transistor circuit, a first potential supply circuit, an output node, a second transistor circuit, and a second potential supply circuit.

The logic gate circuit is provided for decoding the external input signal. The logic gate circuit takes a logical sum or a logical product of a plurality of internal signals obtained in response to the external input signal, and generates the resultant output signal.

The signal generating node generates a control signal. The first transistor circuit receives the plurality of internal signals, and controls the potential of the signal generating node to attain a first level in response to the internal signals. The first potential supply circuit receives the synchronous signal, and brings the potential of the signal generating node to a second level, when the potential of the signal generating node is not controlled to attain the first level.

An output signal is provided from the output node. The second transistor circuit receives the control signal from the signal generating node, and controls the potential of the output node to attain the second level in response to the control signal. The second potential supply circuit receives the synchronous signal, and, in synchronism with the synchronous signal, brings the potential of the output node to the first level when the output node is not controlled to attain the second level.

As described above, only the first transistor circuit among circuits changing the potential of the signal generating node receives the internal signals, and controls the potential of the signal generating node. Further, only the second transistor circuit among circuits changing the potential of the output node receives the internal signals, and controls the potential of the output node.

Therefore, by increasing the second transistor circuit in size, it is possible to increase in speed only one operation of rising and falling of the level of the output signal. As a result, it is easy to increase decode operation in speed. Further, since the first potential control circuit and the second potential control circuit operate in response to the synchronous signal, it is possible to carry out decode operation in synchronism with the synchronous signal.

A semiconductor memory device according to a further aspect of the present invention receiving an external input signal and a synchronous signal and decoding the external input signal in synchronism with the synchronous signal includes a logic gate circuit including a first transistor circuit and a second transistor circuit.

The logic gate circuit is provided for decoding the external input signal. The logic gate circuit takes a logical sum or a logical product of a plurality of internal signals obtained in response to the external input signal, and generates the resultant output signal.

The first transistor circuit receives the plurality of internal signals, and, in response to these signals, brings an output signal to a first level. The second transistor circuit receives the plurality of internal signals, and, in response to these signals, brings an output signal to a second level.

An input capacity of one of the first and second transistor circuits is set larger than that of the other of the first and second transistor circuits.

As described above, an input capacity of one of the first and second transistor circuits is set larger than that of the other transistor. More specifically, by increasing one transistor circuit in size, the input capacity is increased. As a result, only a level change of the output signal corresponding to a transistor circuit increased in size can be increased in speed.

A semiconductor memory device according to a further aspect of the present invention receiving an external input signal and a synchronous signal and decoding the external input signal in synchronism with the synchronous signal includes a logic gate circuit including a signal generating node, a transistor circuit, a first potential supply circuit, a second potential supply circuit, an inverted output circuit, and a precharge circuit.

The logic gate circuit is provided for decoding the external input signal. The logic gate circuit takes a logical sum or a logical product of the plurality of internal signals obtained in response to the external input signal, and generates the resultant output signal.

The signal generating node is for generating an output signal. The transistor circuit receives the plurality of internal signals, and, in response to these internal signals, controls the potential of the signal generating node to a first level.

The first potential supply circuit receives the synchronous signal, and, in response to the synchronous signal, supplies a potential of the first level to the transistor circuit, when the potential of the signal generating node is controlled to attain the first level.

The second potential supply circuit receives the synchronous signal, and supplies a potential of a second level to the signal generating node, when the potential of the signal generating node is not controlled to attain the first level.

The inverted output circuit inverts the signal generated at the signal generating node for output. The precharge circuit precharges the potential of the signal generating node to the second level in response to the signal provided from the inverted output circuit.

As described above, the transistor circuit controls the potential of the signal generating node to attain the first level in response to the internal signals. On the other hand, in the second potential supply circuit and the precharge circuit bringing the potential of the signal generating node to the second level, the second potential supply circuit controls the potential of the signal generating node in response to the synchronous signal, and the precharge circuit controls the potential of the signal generating node in response to the output signal of the inverted output circuit. Therefore, these circuits do not receive the internal signals directly.

Therefore, by increasing a transistor configuring the transistor circuit in size, it is possible to increase in speed only one operation of rising and falling of the level of the output signal. Therefore, it is easy to increase decode operation in speed.

A semiconductor memory device according to a further aspect of the present invention receiving an external input signal and a synchronous signal and decoding the external input signal in synchronism with the synchronous signal includes a logic gate circuit including a first transistor and a second transistor.

The logic gate circuit is provided for decoding the external input signal. The logic gate circuit inverts an internal signal obtained in response to the external input signal, and generates the resultant output signal.

The first transistor receives the internal signal, and controls the potential of the output signal to attain a first level in response to the internal signal. The second transistor receives the internal signal, and controls the potential of the output signal to attain a second level in response to the internal signal. An input capacity of one of the first and second transistors is set larger than that of the other transistor.

As described above, an input capacity of one of the first and second transistors is set larger than that of the other transistor. More specifically, by increasing one transistor in size, the input capacity is set large. As a result, it is possible to increase in speed only level change of an output signal corresponding to a transistor increased in size.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in detail with reference to the drawings.

First Embodiment

Figure 1:
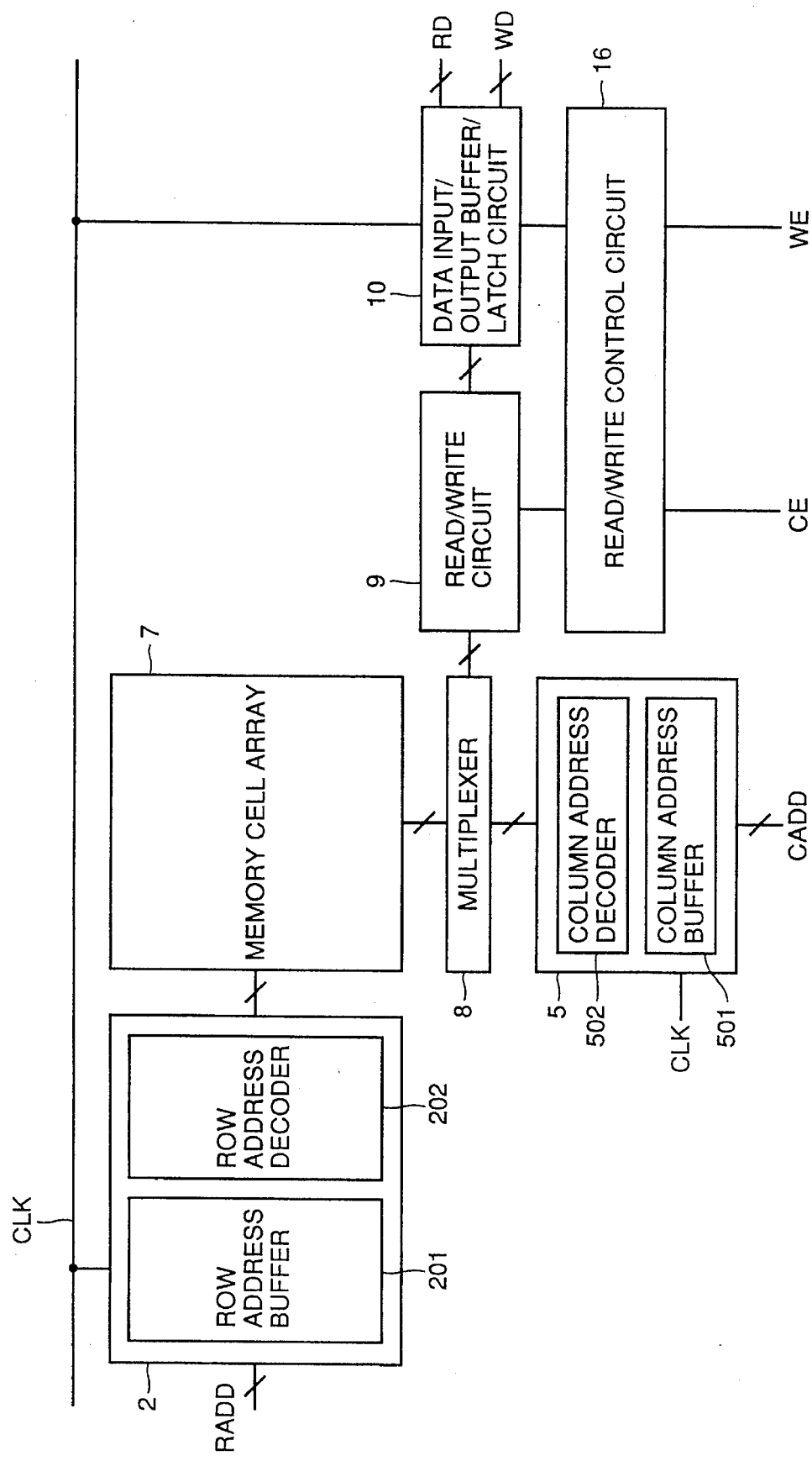
FIG. 1 is a block diagram showing a configuration of a synchronous SRAM according to a first embodiment.
Figure 23:
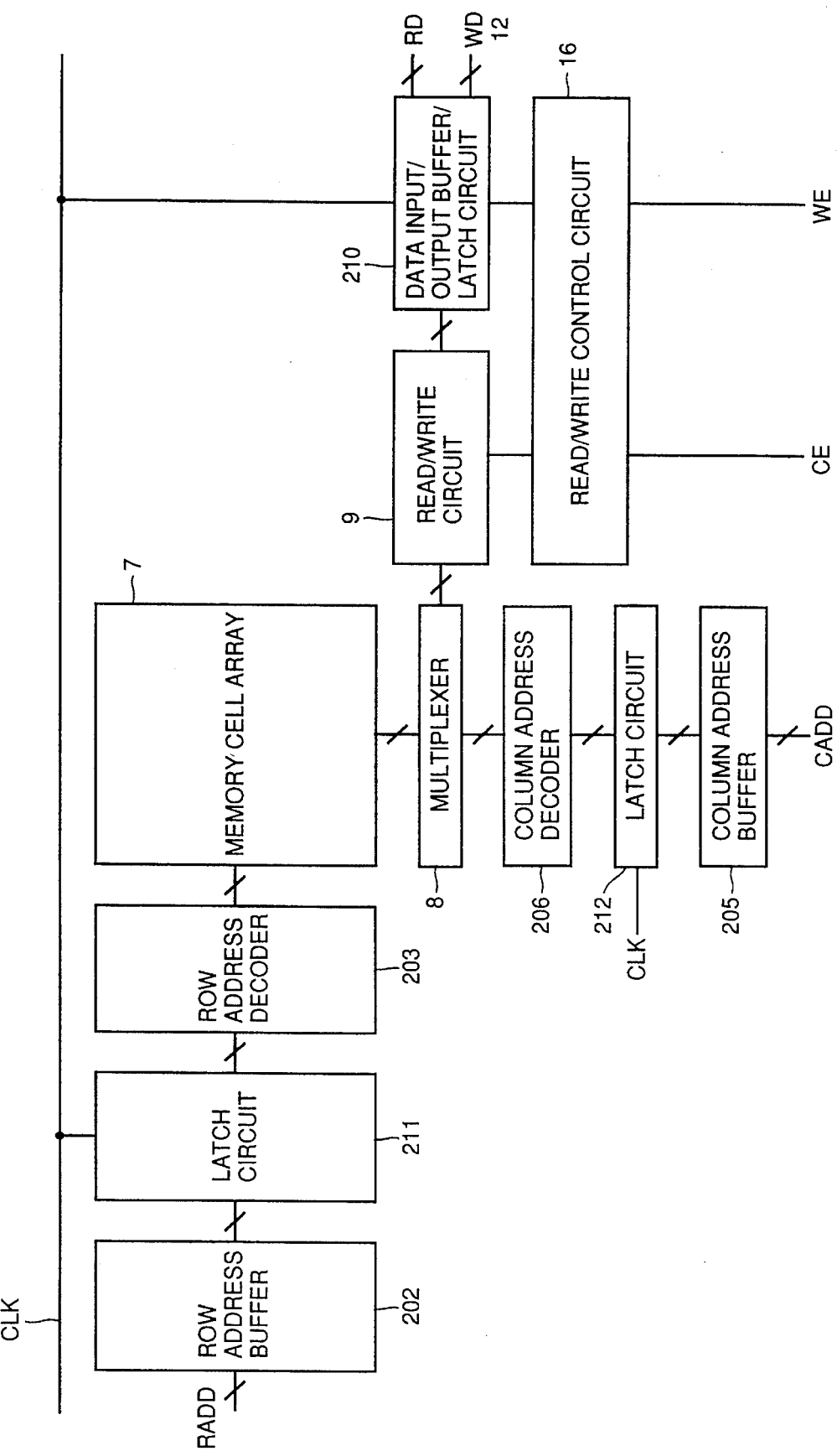
FIG. 23 is a block diagram showing a configuration of a conventional synchronous SRAM.
Figure 24:
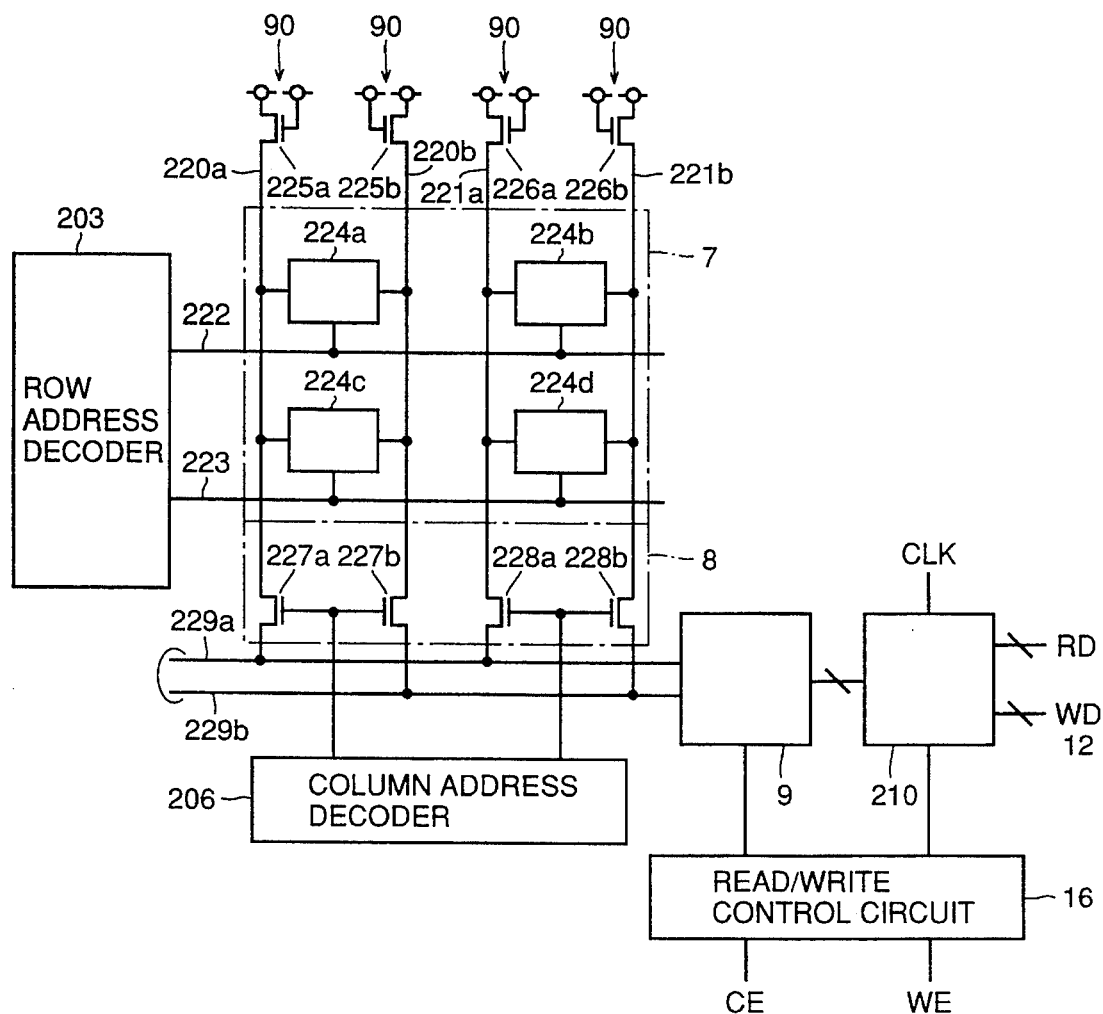
FIG. 24 is a block diagram showing a detailed configuration of a peripheral portion of a memory cell array of the SRAM shown in FIG. 23.
Figure 25:
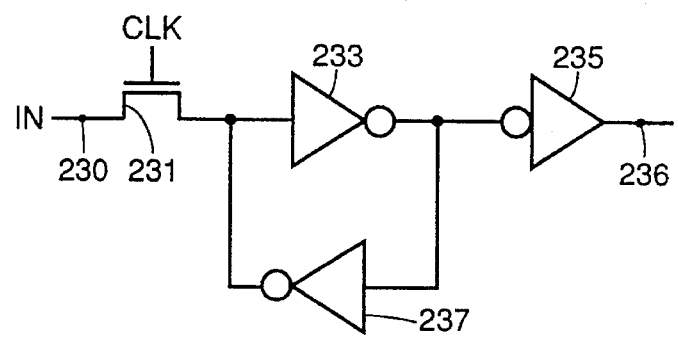
FIG. 25 is a circuit diagram showing one example of a configuration of a latch circuit.
Figure 26:
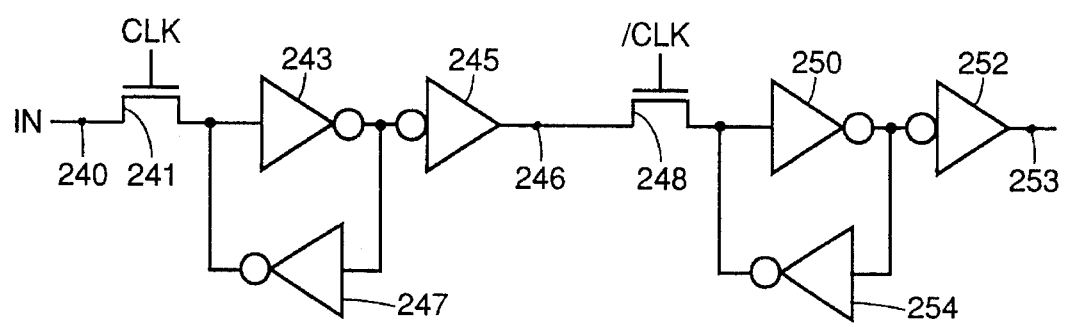
FIG. 26 is a circuit diagram showing another example of the configuration of the latch circuit.
Figure 27:
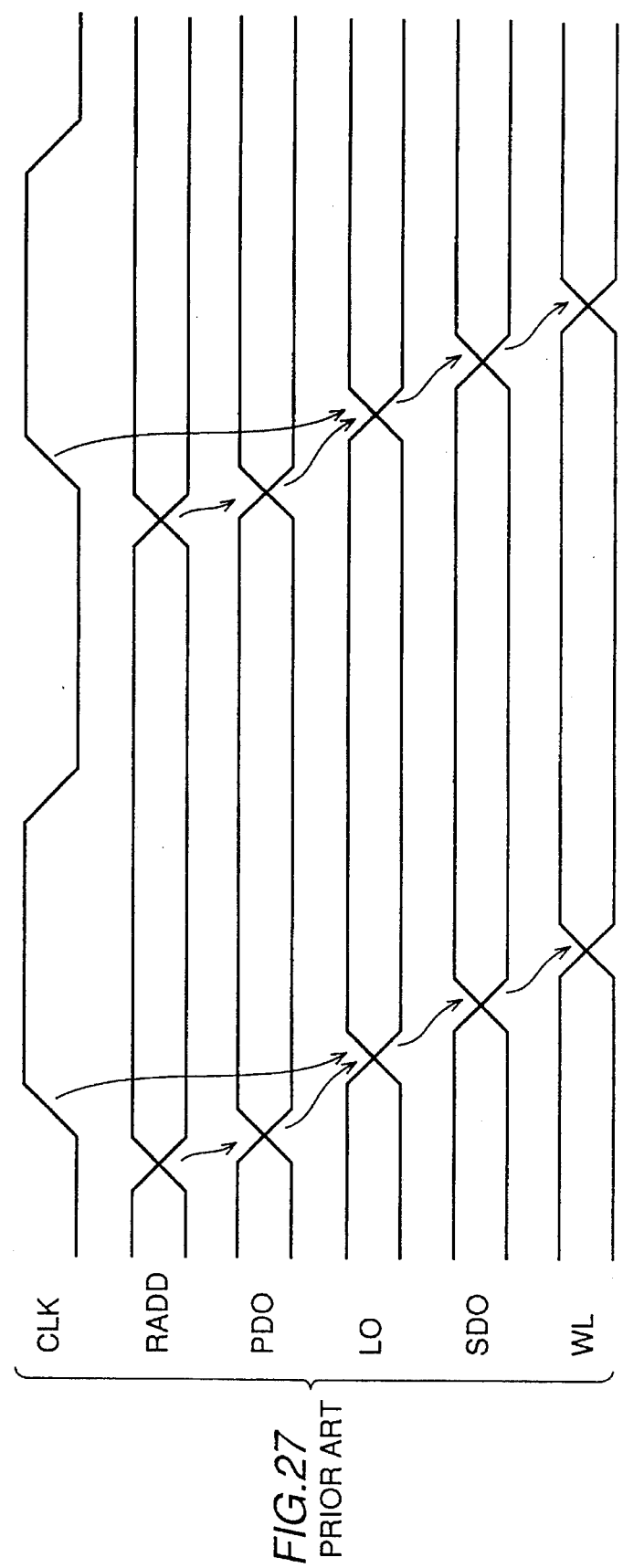
FIG. 27 is a timing chart showing timings of address selection operation of the SRAM shown in FIG. 23.

FIG. 1 is a block diagram showing a configuration of a synchronous SRAM according to the first embodiment. FIG. 1 corresponds to FIG. 23. The same reference characters denote the same or corresponding portions as those of FIG. 23, and the description thereof will not be repeated. The synchronous SRAM of FIG. 1 is different from that of FIG. 23 in that a latch circuit operating in synchronism with a synchronous signal CLK is not provided.

In FIG. 1, a row address signal RADD is applied to a row address processing circuit 2. Row address processing circuit 2 includes row address buffer 201 and row address decoder 202. Row address buffer 201 includes a phase splitter, a predecoder, and a logical product gate. Row address decoder 102 is formed of decoders in multiple stages, including a global decoder and a subdecoder.

Row address processing circuit 2 operates in synchronism with synchronous signal CLK. In operation, row address processing circuit 2 decodes row address signal RADD, and selects a word line in memory cell array 7.

A column address signal CADD is applied to a column address processing circuit 5. Column address processing circuit 5 includes a column address buffer 501 and a column address decoder 502. Column address buffer 501 and column address decoder 502 in column address processing circuit 5 have the same configuration as that of row address buffer 201 and row address decoder 202 in row address processing circuit 2.

Column address processing circuit 5 operates in synchronism with synchronous signal CLK. In operation, column address processing circuit 5 decodes column address signal CADD, and selects a bit line pair of memory cell array 7 through multiplexer 8.

In row address processing circuit 2 of the synchronous SRAM, a logical product of an output signal of the phase splitter or an output signal of the predecoder, and synchronous signal CLK is taken by the logic gate.

Therefore, an output signal of row address buffer 201 is activated when synchronous signal CLK is activated, and deactivated when synchronous signal CLK is deactivated.

In each of logic gates configuring row address decoder 202 of row address processing circuit 2, operation for selecting a word line is carried out at a higher speed than operation for non-selecting a word line.

Column address buffer 501 and column address decoder 502 in column address processing circuit 5 have the same function as row address buffer 201 and row address decoder 202 in row address processing circuit 2.

Figure 2:
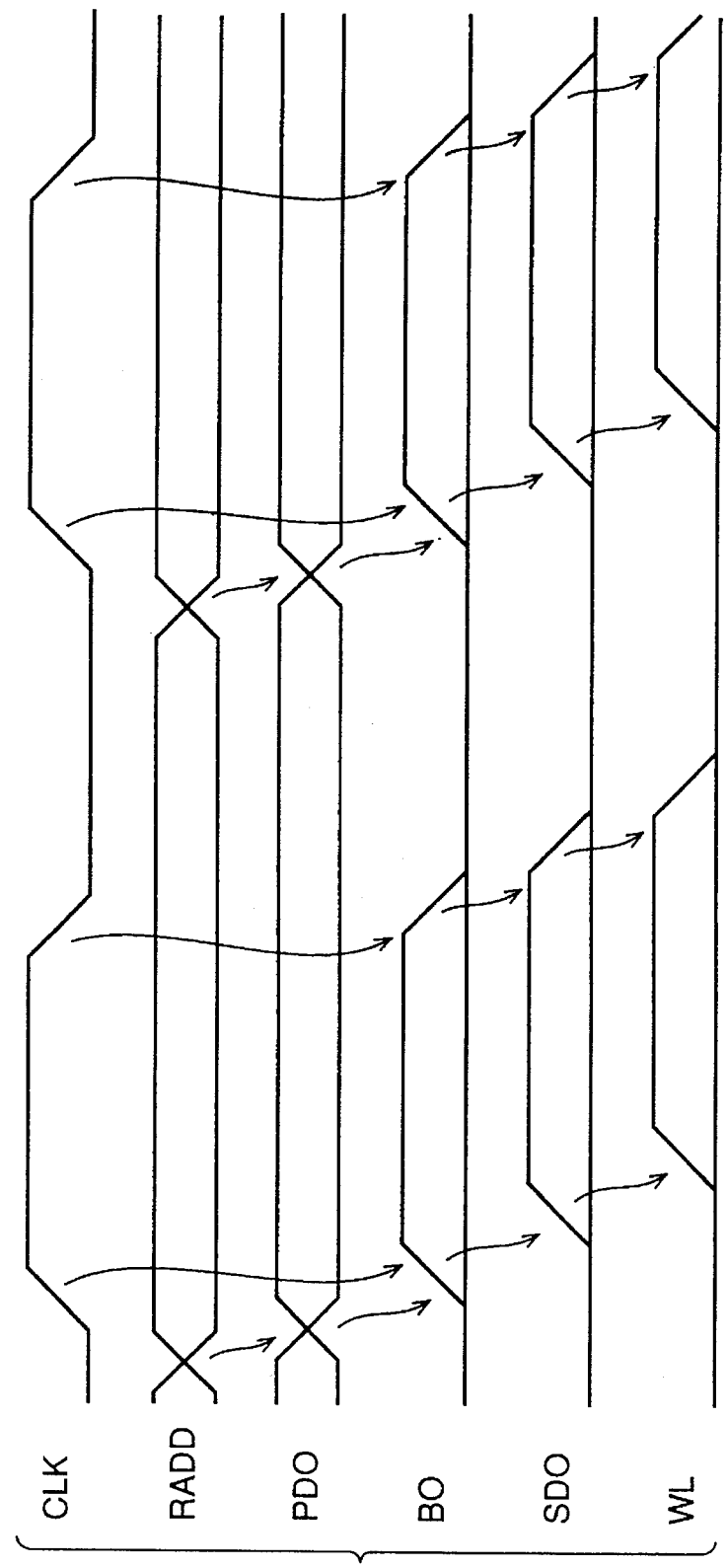
FIG. 2 is a timing diagram showing operation of the synchronous SRAM shown in FIG. 1.

Operation of the synchronous SRAM shown in FIG. 1 will now be described. FIG. 2 is a timing diagram showing operation of the synchronous SRAM shown in FIG. 1. In FIG. 2, synchronous signal CLK, row address signal RADD, predecoder output signal PDO, row address buffer output signal BO, subdecoder output signal SDO, and word line select signal WL are shown.

Row address signal RADD is applied to row address processing circuit 2. In row address buffer 201, a logical product of a signal amplified, and inverted and amplified by the phase splitter or a signal predecoded by the predecoder, and synchronous signal CLK is taken, and the resultant signal is provided.

Therefore, when synchronous signal CLK is in an active state (for example, the H level), row address buffer output signal BO is transmitted to row address decoder 202.

In row address decoder 202, since operation for selecting a word line is carried out at a high speed as described above, a select signal is transmitted to the final stage at a high speed. On the other hand, a non-select signal is transmitted to the final stage at a speed within a cycle of synchronous signal CLK.

The final stage (local decoder) of row address decoder 202 is a stage for selecting a word line. In the final stage, a particular word line is brought to a selected level, and the other word lines are brought to a non-selected level. As described above, since operation for selecting a word line is increased in speed with priority over operation for non-selecting word line, selection of a word line is carried out at a high speed. On the other hand, since non-selection of a word line may be carried out at a relatively low speed, it is carried out at a speed within a cycle of synchronous signal CLK, as described above.

In operation for selecting a bit line pair, column address signal CADD is applied to column address processing circuit 5. Similar to the case of row address processing circuit 2, since operation for selecting a bit line pair is increased in speed with priority over operation for non-selecting a bit line pair in column address processing circuit 5, selection of a bit line pair is carried out at a high speed.

On the other hand, since operation for non-selecting a bit line pair may be carried out at a relatively low speed, it is carried out at a speed within a cycle of synchronous signal CLK.

Specific examples of respective circuits configuring row address processing circuit 5 will be described hereinafter.

Figure 3:
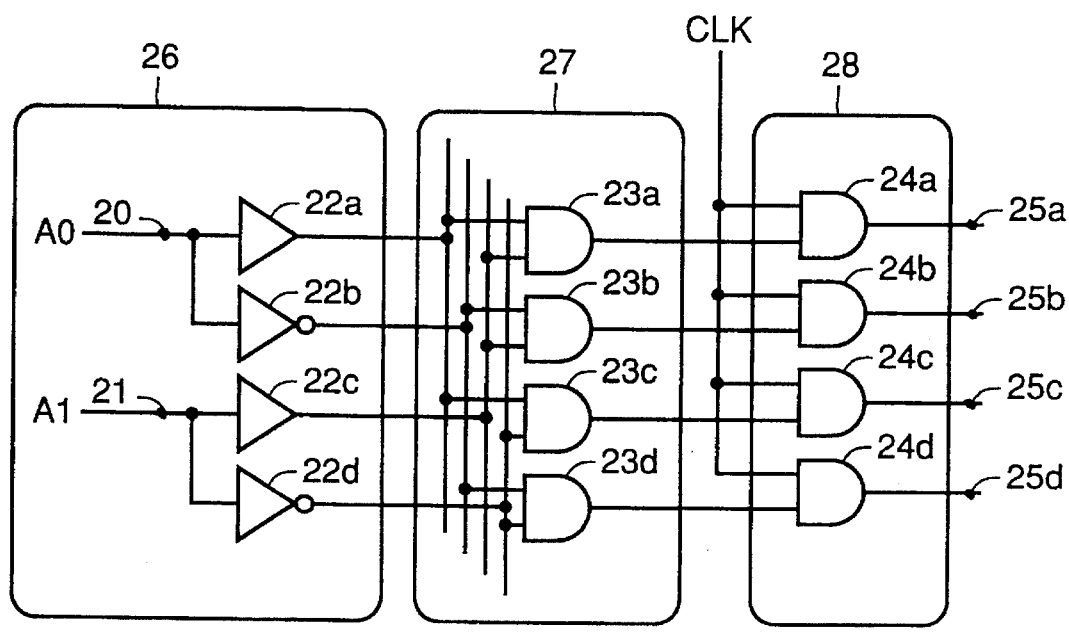
FIG. 3 is a circuit diagram showing a first example of a row address buffer used in a row address processing circuit.

FIG. 3 is a circuit diagram showing a first example of row address buffer 201 used in row address processing circuit 2 of the synchronous SRAM shown in FIG. 1.

Referring to FIG. 3, the row address buffer includes a phase splitter 26, a predecoder 27, and a logical product gate 28.

Phase splitter 26 includes buffer amplifiers 22a, 22c, and inverters 22b, 22d. Address signal A0 is applied through an input signal node 20. Applied address signal A0 is amplified by buffer amplifier 22a, and inverted and amplified by inverter 22b.

Address signal A1 is applied through an input signal node 21. Applied address signal A1 is amplified by buffer amplifier 22c, and inverted and amplified by inverter 22d.

Predecoder 27 includes AND gates 23a to 23d. AND gate 23a receives an output signal from buffer amplifier 22a and an output signal from inverter 22c. AND gate 23b receives an output signal from inverter 22b and an output signal from buffer amplifier 22c.

AND gate 23c receives an output signal from buffer amplifier 22a and an output signal from inverter 22d. AND gate 23d receives an output signal from inverter 22b and an output signal from inverter 22d. Each of AND gates 23a to 23d provides an output signal at the H level when two applied signals are both at the H level.

Logical product gate 28 includes AND gates 24a to 24d. AND gates 24a to 24d receive synchronous signal CLK, respectively. AND gate 24a further receives an output signal from AND gate 23a. AND gate 24b further receives an output signal from AND gate 23b. AND gate 24c further receives an output signal from AND gate 23c. AND gate 24d further receives an output signal from AND gate 23d.

Each of AND gates 24a to 24d provides an output signal at the H level when two applied signals are both at the H level. Output signals from AND gates 24a to 24d are provided through output nodes 25a to 25d, respectively.

Therefore, when synchronous signal CLK is at the H level, a predecode signal provided from predecoder 27 is transmitted to row address decoder 202 at the next stage.

Figure 4:
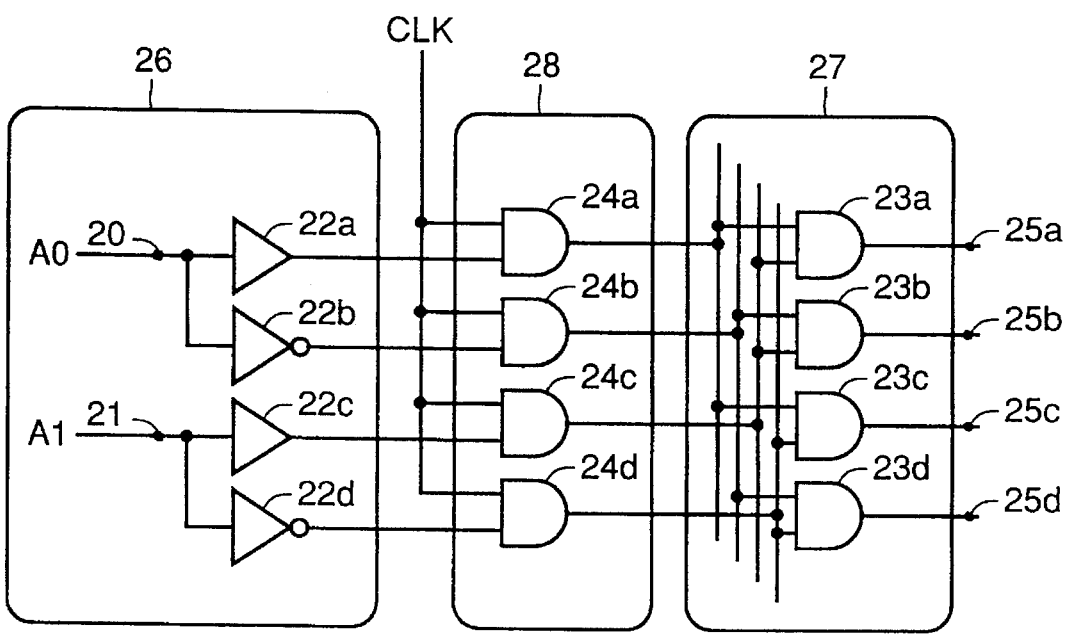
FIG. 4 is a circuit diagram showing a second example of the row address buffer used in the row address processing circuit.

FIG. 4 is a circuit diagram showing a second example of row address buffer 201 used in row address processing circuit 2 of the synchronous SRAM shown in FIG. 1.

Referring to FIG. 4, the row address buffer also includes phase splitter 26, predecoder 27, and logical product gate 28. The row address buffer of FIG. 4 is different from that of FIG. 3 in that logical product gate 28 is provided between phase splitter 26 and predecoder 27.

In logical product gate 28, AND gate 24a receives an output signal from buffer amplifier 22a and synchronous signal CLK. AND gate 24b receives an output signal from inverter 22b and synchronous signal CLK. AND gate 24c receives an output signal from buffer amplifier 22c and synchronous signal CLK. AND gate 24d receives an output signal from inverter 22d and synchronous signal CLK.

Each of AND gates 24a to 24d provides an output signal at the H level when two applied signals are both at the H level.

AND gate 23a receives an output signal from AND gate 24a and an output signal from AND gate 24c. AND gate 23b receives an output signal from AND gate 24b and an output signal from AND gate 24c. AND gate 23c receives an output signal from AND gate 24a and an output signal from AND gate 24d. AND gate 23d receives an output signal from AND gate 24b and an output signal from AND gate 24d.

Each of AND gates 23a to 23d provides an output signal at the H level when two applied signals are both at the H level.

Therefore, when synchronous signal CLK is at the H level, a predecode signal is transmitted to row address decoder 202 at the next stage.

Figure 5:
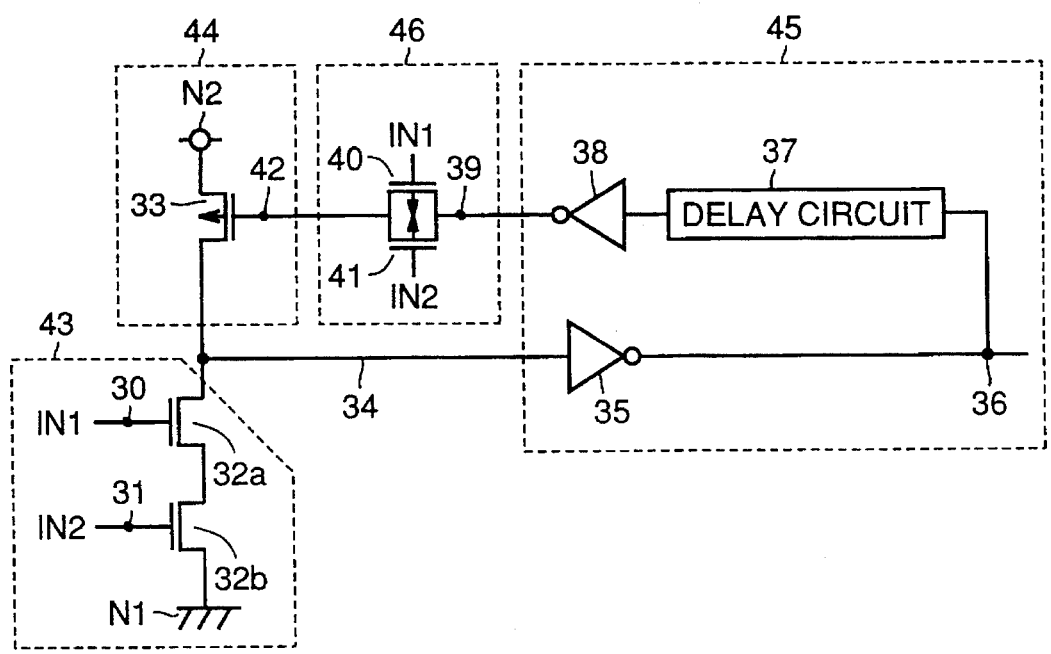
FIG. 5 is a circuit diagram showing a first example of a logic gate of a row address decoder used in the row address processing circuit.

FIG. 5 is a circuit diagram showing a first example of the logic gate of row address decoder 202 used in row address processing circuit 2 of the synchronous SRAM shown in FIG. 1.

The logic gate includes a first network circuit 43, a charging circuit 44, a precharge signal generating circuit 45, and a second network circuit 46.

First network circuit 43 includes NMOS transistors 32a and 32b. Transistors 32a and 32b are connected between a node 34 and a first power supply node N1 receiving a first potential. Transistor 32a receives internal signal IN1 applied through an input node 30 at its gate. Transistor 32b receives internal signal IN2 applied through an input node 31 at its gate.

Precharge signal generating circuit 45 includes inverters 35, 38, and a delay circuit 37. Inverter 35 is connected between node 34 and an output node 36. Delay circuit 37 and inverter 38 are connected between output node 36 and a node 39 between second network circuit 46 and precharge signal generating circuit 45.

Second network circuit 46 includes PMOS transistors 40, 41 having their drains and sources connected together. Transistors 40, 41 are connected between a node 39 and a node 42 between second network circuit 46 and charging circuit 44. Charging circuit 44 includes a PMOS transistor 33. Transistor 33 is connected between a second power supply node N2 receiving a second potential and node 34. Transistor 33 receives the potential of node 42 at its gate.

In such a configuration as described above, when transistors 32a, 32b of first network circuit 43 are rendered conductive, transistors 40, 41 of second network circuit 46 are rendered non-conductive. On the contrary, when transistors 32, 32b of first network circuit 43 are rendered non-conductive, transistors 40, 41 of second network circuit 46 are rendered conductive.

Figure 6:
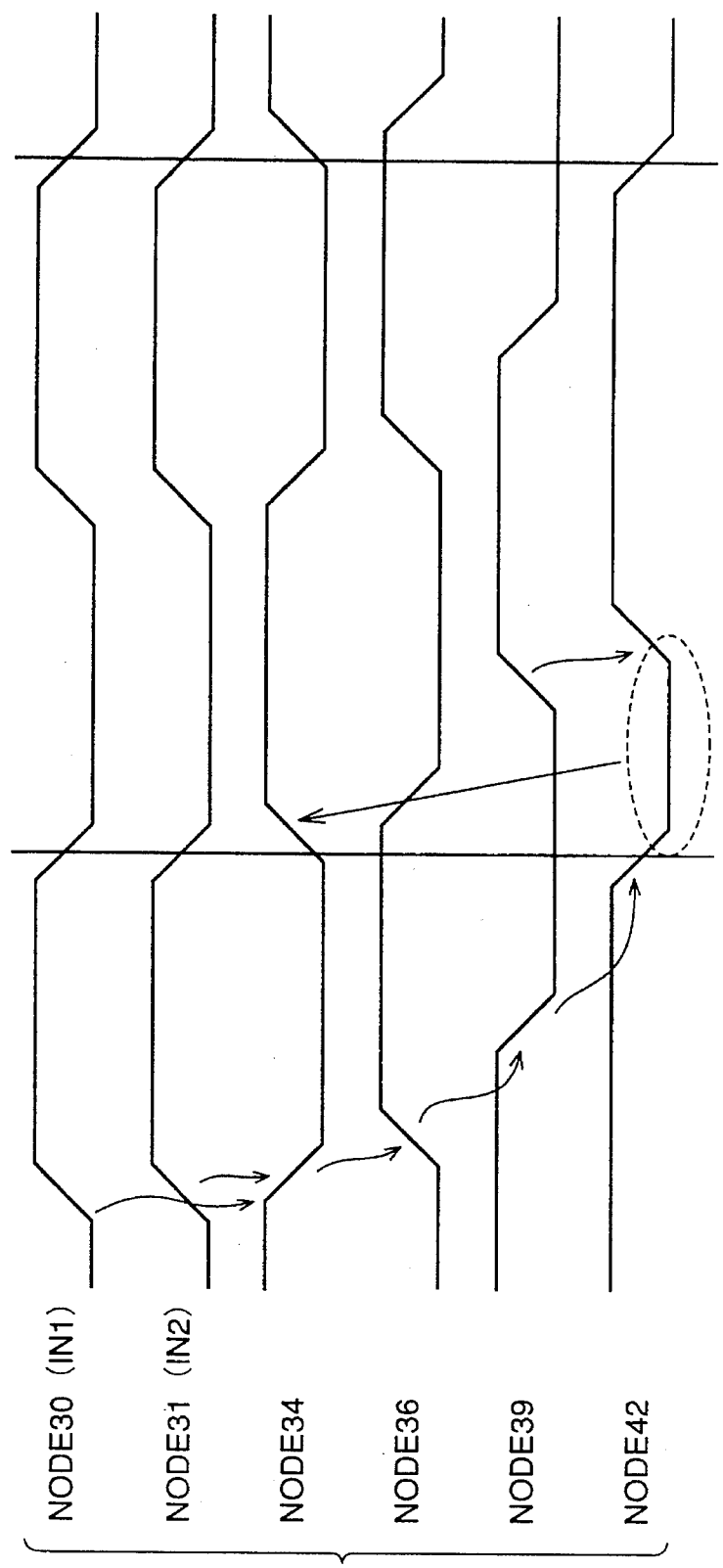
FIG. 6 is a timing chart showing operation of the logic gate of FIG. 5.

Operation of the logic gate shown in FIG. 5 will now be described. FIG. 6 is a timing chart showing operation of the logic gate shown in FIG. 5. In FIG. 6, signal waveforms at nodes 30 (IN1), 31 (IN2), 34, 36, 39 and 42 are shown.

For simplicity of description, the case is described where internal signals IN1 and IN2 have rectangular waves, and change in phase.

When internal signals IN1, IN2 applied to the gates of transistors 32a, 32b change from the L level to the H level, both transistors 32a, 32b are rendered conductive. However, at respective nodes 34, 36 and 39, a signal is delayed, inverted, and then propagated. In this case, the signal at node 39 attains the L level after a predetermined time due to delay circuit 37.

At this point, the L level is not transmitted to node 42 since transistors 40, 41 of second network circuit 46 are not rendered conductive.

When internal signals IN1 and IN2 change from the H level to the L level, a signal is delayed, inverted, and then propagated at node 34, output node 36, and node 39. In this case, the potential of node 39 attains the H level.

It should be noted that transistors 40, 41 of second network circuit 46 are rendered conductive when internal signals IN1 and IN2 change from the H level to the L level. Therefore, the L level of node 39 is propagated to node 42. As a result, transistor 33 is rendered conductive, and node 34 is charged to the second potential. In this case, output node 36 attains the L level.

The L level of output node 36 is maintained until internal signals IN1, IN2 both attain the H level.

Compared to a general NAND circuit receiving an input signal at PMOS and NMOS transistors, the logic gate shown in FIG. 5 carrying out such operation receives an input signal only at the NMOS transistor, resulting in a more decreased input capacity.

Therefore, high speed operation for changing an output signal from the L level to the H level can be achieved. Since the capacity of node 34 takes a total value of the drain capacity of transistor 32a, the drain capacity of transistor 33, and the gate capacity of inverter 35, the value is small.

Figure 7:
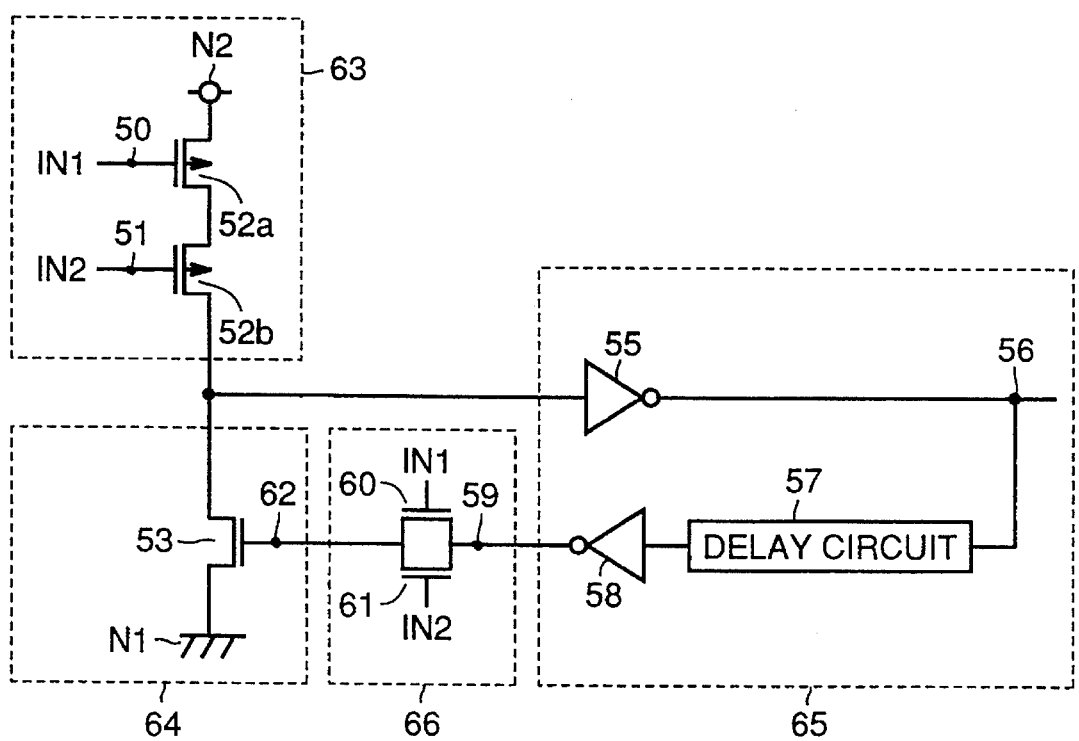
FIG. 7 is a circuit diagram showing a second example of the logic gate of the row address decoder used in the row address processing circuit.

Description will now be given of another example of the logic gate. FIG. 7 is a circuit diagram showing a second example of the logic gate of row address decoder 202 used in row address processing circuit 2 of the synchronous SRAM shown in FIG. 1. The logic gate includes a first network circuit 63, a charging circuit 64, a precharge signal generating circuit 65, and a second network circuit 66.

First network circuit 63 includes PMOS transistors 52a and 52b. Transistors 52a and 52b are connected between a node 54 and second power supply node N2. Transistor 52a receives internal signal IN1 applied through an input node 50 at its gate. Transistor 52b receives input signal IN2 applied through an input node 51 at its gate.

Precharge signal generating circuit 65 includes inverters 55, 58, and a delay circuit 57.

Inverter 55 is connected between node 54 and an output node 56. Delay circuit 57 and inverter circuit 58 are connected between output node 56 and a node 59 between precharge signal generating circuit 65 and second network circuit 66.

Second network circuit 66 includes NMOS transistors 60, 61 having their drains and sources connected together. Transistors 60, 61 are connected between node 59 and a node 62 between second network circuit 66 and charging circuit 64. Charging circuit 64 includes an NMOS transistor 53. Transistor 53 is connected between a first power supply node N1 and node 54, and receives the potential of node 62 at its gate.

In such a configuration as described above, when transistors 52a, 52b of first network circuit 63 are rendered conductive, transistors 60, 61 of second network circuit 66 are rendered non-conductive. On the contrary, when transistors 52a, 52b of first network circuit 63 are rendered non-conductive, transistors 60, 61 of second network circuit 66 are rendered conductive.

Figure 8:
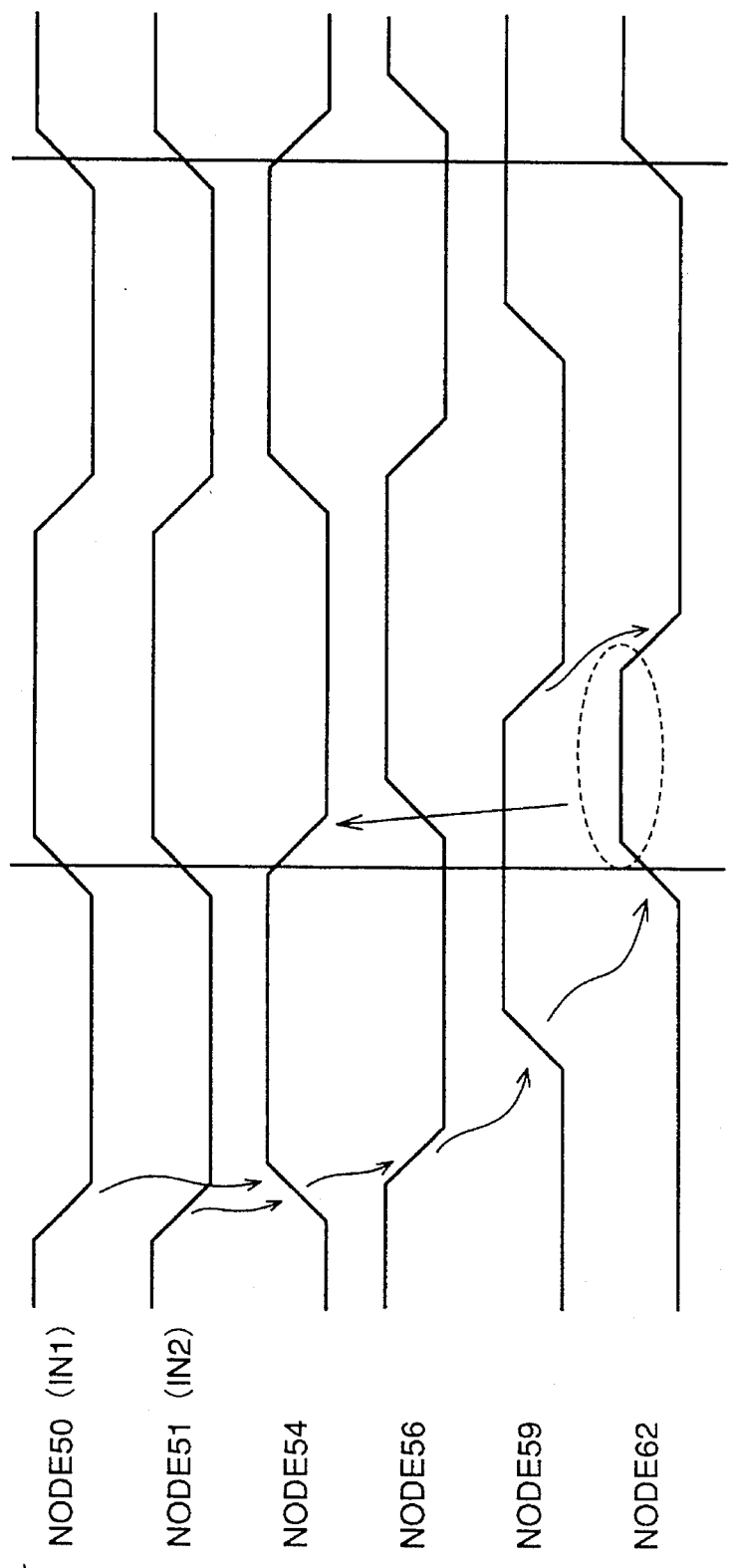
FIG. 8 is a timing chart showing operation of the logic gate of FIG. 7.

Operation of the logic gate shown in FIG. 7 will now be described. FIG. 8 is a timing chart showing operation of the logic gate of FIG. 7.

In FIG. 8, signal waveforms at nodes 50, 51, 54, 56, 59 and 62 are shown. For simplicity of description, description will be given of the case where internal signals IN1 and IN2 have rectangular waveforms, and change in phase.

First, when internal signals IN1, IN2 applied to nodes 50, 51 change from the H level to the L level, transistors 52a, 52b are both rendered conductive. Therefore, a signal is delayed, inverted and propagated at node 54, output node 56, and node 59.

In this case, a signal at node 59 attains the H level after a preset time due to delay circuit 57. Since transistors 60, 61 of second network circuit 66 are not rendered conductive at this time, the H level is not propagated to node 62.

When internal signals IN1 and IN2 change from the L level to the H level, a signal is delayed, inverted, and propagated at node 54, output node 56, and node 59. In this case, the potential of node 59 attains the L level.

It should be noted that transistors 60, 61 of second network circuit 66 are rendered conductive at the time when internal signals IN1 and IN2 change from the L level to the H level. Therefore, the H level of node 59 is propagated to node 62. As a result, transistor 53 is rendered conductive, and node 54 is charged to the first potential. In this case, output node 56 attains the H level.

The H level of output node 56 is maintained until internal signal IN1, IN2 both attain the L level.

The logic gate shown in FIG. 7 carrying out such operation as described above receives an input signal only at the PMOS transistor. Therefore, compared to a general NOR circuit receiving an input signal at PMOS and NMOS transistors, the input capacity can be more reduced.

As a result, operation for changing an output signal from the H level to the L level can be increased in speed. Since the capacity of node 54 takes a total value of the drain capacity of transistor 52b, the drain capacity of transistor 53, and the gate capacity of inverter 55, the value is small.

Figure 9:
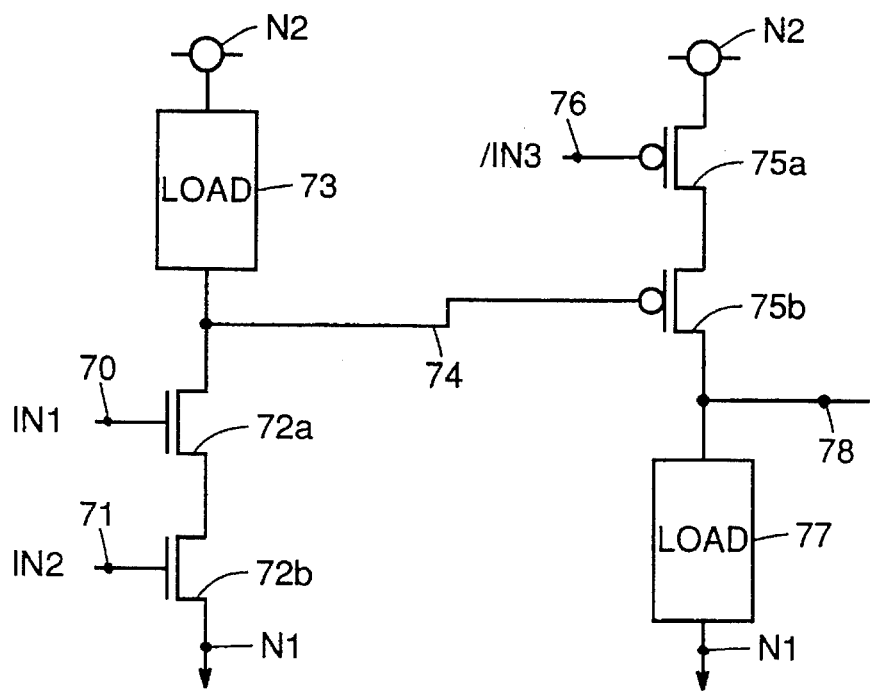
FIGS. 9 to 21 are circuit diagrams showing third to fifteenth examples of the logic gate of the row address decoder used in the row address processing circuit.

Description will now be given of a third example of the logic gate configuring row address decoder 202 of row address processing circuit 2 shown in FIG. 1. FIG. 9 is a circuit diagram showing the third example of the logic gate of the row address decoder used in row address processing circuit 2 of the synchronous SRAM shown in FIG. 1.

In the logic gate shown in FIG. 9, operation for changing an output signal from the L level to the H level is carried out at a higher speed than operation for changing an output signal from the H level to the L level.

Referring to FIG. 9, the logic gate includes NMOS transistors 72a, 72b, loads 73, 77, and PMOS transistors 75a, 75b. Transistors 72a and 72b are connected in series between a node 74 and first power supply node N1. Transistor 72a is connected to an input node 70 at its gate. Transistor 72b is connected to an input node 71 at its gate. Input nodes 70 and 71 receive internal signals IN1 and IN2, respectively.

Load 73 is connected between second power supply node N2 and node 74. Transistors 75a and 75b are connected between second power supply node N2 and an output node 78. Transistor 75a is connected to an input node 76 at its gate. Input node 76 receives an internal signal /IN3 at its gate.

Transistor 75b is connected to node 74 at its gate. Load 77 is connected between node 78 and first power supply node N1.

Operation of the logic gate of FIG. 9 will now be described. In this logic gate, when internal signals IN1, IN2 are both at the H level, the potential of node 74 attains the L level. On the contrary, when either internal signals IN1 or IN2 is at the L level, the potential of node 74 is brought to the H level by load 73.

When the potential of node 74 and internal signal /IN3 are both at the L level, the potential of output node 78 attains the H level. On the contrary, when either the potential of node 74 or internal signal /IN3 is at the H level, the potential of output node 78 is brought to the L level by load 77.

In the logic gate of FIG. 9, transistors 75a and 75b are increased in size. Therefore, operation for changing an output signal from output node 78 from the L level to the H level is increased in speed, resulting in high speed operation associated with selection of a word line.

Figure 10:
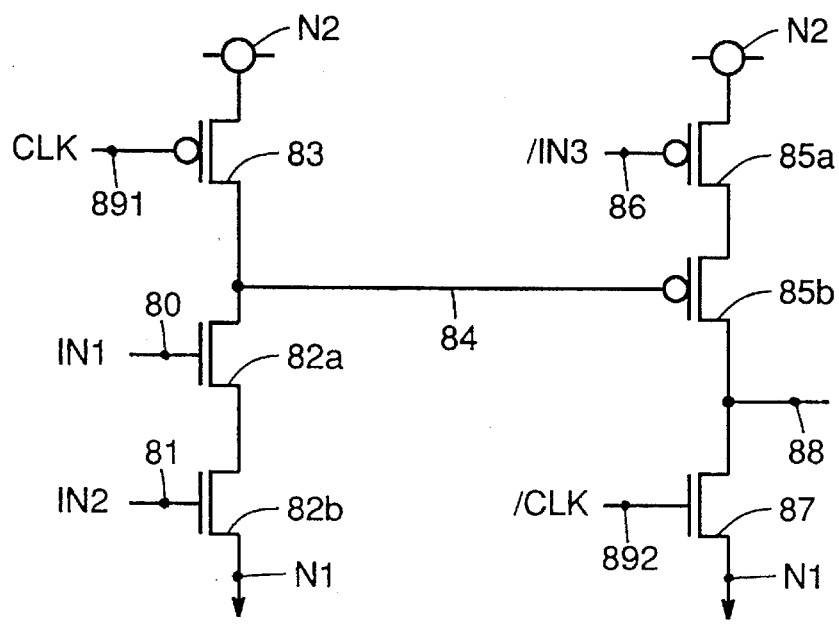

Description will now be given of a fourth example of the logic gate configuring the row address decoder of row address processing circuit 2 shown in FIG. 1. FIG. 10 is a circuit diagram showing the fourth example of the logic gate of row address decoder 202 used in row address processing circuit 2 of the synchronous SRAM shown in FIG. 1.

In the logic gate shown in FIG. 10, operation for changing an output signal from the L level to the H level is carried out at a higher speed than operation for changing an output signal from the H level to the L level.

Referring to FIG. 10, the logic gate includes NMOS transistors 82a, 82b, 87, and PMOS transistors 83, 85a, 85b. Transistors 82a, 82b, 85a, 85b, input nodes 80, 81, 86, a node 84, and an output node 88 in FIG. 10 correspond to transistors 72a, 72b, 75a, 75b, input nodes 70, 71, 76, node 74, and output node 78 in FIG. 9, respectively.

The logic gate shown in FIG. 10 is different from that of FIG. 9 in that PMOS transistor 83 is connected between node 84 and second power supply node N2, and that NMOS transistor 82 is connected between output node 88 and first power supply node N1.

Transistor 83 receives synchronous signal CLK through an input node 891 at its gate. Transistor 87 receives an inverted synchronous signal /CLK through an input node 892 at its gate.

Operation of the logic gate shown in FIG. 10 will now be described. When synchronous signal CLK is at the H level, a signal is transmitted to a logic gate at the next stage. On the contrary, when synchronous signal CLK is at L level, respective potentials at node 84 and output node 88 are both brought to a precharge level.

The case where synchronous signal CLK is at the H level will be described in the following. When internal signals IN1, IN2 are both at the H level, the potential of node 84 attains the L level. On the other hand, when either internal signals IN1 or IN2 is at the L level, the potential of node 84 maintains the H level which is the precharge level.

When the potential of node 84 and internal signal /IN3 are both at the L level, the potential of output node 88 is brought to the H level. On the other hand, when either the potential of node 84 or internal signal /IN3 is at the H level, the potential of output node 88 maintains the L level which is the precharge level.

In the logic gate shown in FIG. 10, transistors 85a and 85b are increased in size. As a result, operation for changing an output signal from the L level to the H level is increased in speed. The logic gate operates in synchronism with synchronous signal CLK and inverted synchronous signal /CLK.

Figure 11:
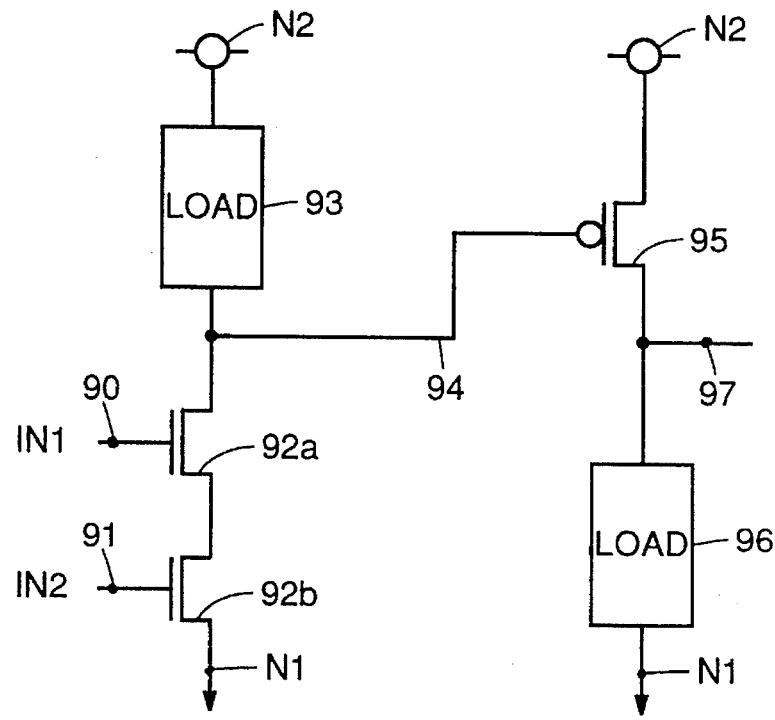

Description will now be given of a fifth example of the logic gate configuring row address decoder 202 of row address processing circuit 2 shown in FIG. 1. FIG. 11 is a circuit diagram showing the fifth example of the logic gate of the row address decoder 202 used in row address processing circuit 2 of the synchronous SRAM shown in FIG. 1.

In the logic gate shown in FIG. 11, operation for changing an output signal from the L level to the H level is increased in speed.

Referring to FIG. 11, the logic gate includes NMOS transistors 92a, 92b, loads 93, 96, and a PMOS transistor 95. Transistors 92a, 92b, 95, loads 93, 96, input nodes 90, 91, a node 94, and an output node 97 in FIG. 11 correspond to transistors 72a, 72b, 75b, loads 73, 77, input nodes 70, 71, node 74, and output node 78 in FIG. 9, respectively.

The logic gate shown in FIG. 11 is different from that of FIG. 9 in that a transistor operating in response to an internal signal is not provided between second power supply node N2 and transistor 95.

Operation of the logic gate shown in FIG. 11 will now be described. When internal signals IN1, IN2 are both at the H level, node 94 attains the L level. On the other hand, either internal signals IN1 or IN2 is at the L level, the potential of node 94 is brought to the H level by load 93.

When the potential of node 94 is at the L level, the potential of output node 97 is brought to the H level. On the other hand, when the potential of node 94 is at the H level, the potential of output node 97 is brought to the L level by load 96.

Also in this logic gate, the size of transistor 95 is set large. As a result, operation for changing an output signal from the L level to the H level is increased in speed.

Figure 12:
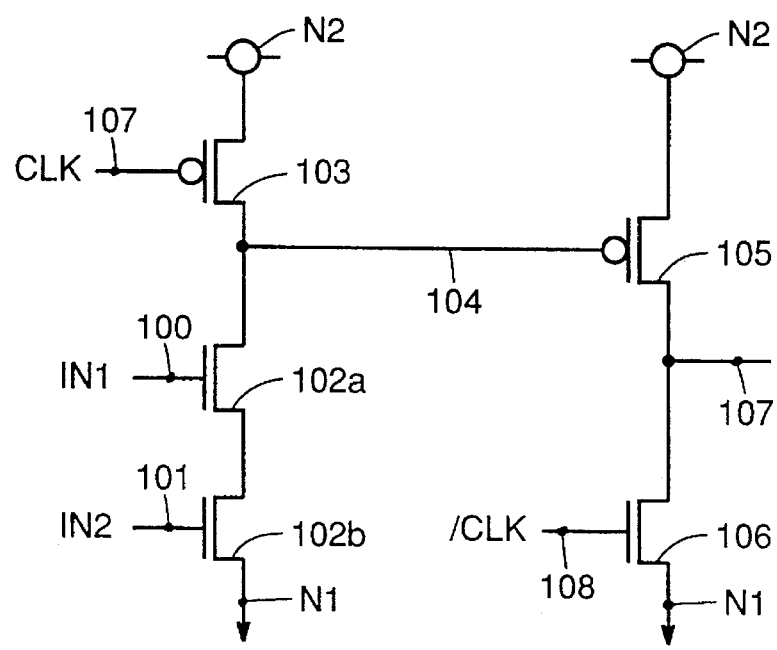

Description will now be given of a sixth example of the logic gate configuring row address decoder 202 of row address processing circuit 2. FIG. 12 is a circuit diagram showing the sixth example of the logic gate of row address decoder 202 used in row address processing circuit 2 of the synchronous SRAM shown in FIG. 1. In the logic gate shown in FIG. 12, operation for changing an output signal from the L level to the H level is increased in speed.

Referring to FIG. 12, the logic gate includes NMOS transistors 102a, 102b, 106, and PMOS transistors 103, 105. Transistors 102a, 102b, 103, 105, 106, input nodes 100, 101, 108, 109, a node 104, and an output node 107 in FIG. 12 correspond to transistors 82a, 82b, 83, 85b, 87, input nodes 80, 81, 891, 892, node 84, and output node 88 in FIG. 10, respectively.

The logic gate shown in FIG. 12 is different from that of FIG. 10 in that a transistor operating in response to an internal signal is not provided between second power supply node N2 and transistor 105.

Operation of the logic gate shown in FIG. 12 will now be described. When synchronous signal CLK is at the H level, an output signal is transmitted to a logic gate at the next stage. On the other hand, when synchronous signal CLK is at the L level, node 104 and output node 107 to which a signal is transmitted are both set to the precharge level.

The case where synchronous signal CLK is at the H level will be described in the following. When internal signals IN1, IN2 are both at the H level, the potential of node 104 attains the L level. On the other hand, when either internal signals IN1 or IN2 is at the L level, the potential of node 104 maintains the H level which is the precharge level.

When the potential of node 104 is at the L level, the potential of output node 107 attains the H level. On the other hand, when the potential of node 104 is at the H level, the potential of output node 107 maintains the L level which is the precharge level.

In the logic gate, the size of transistor 105 is set large. Therefore, operation for changing an output signal from the L level to the H level is increased in speed. Further, the logic gate operates in synchronism with synchronous signal CLK and inverted synchronous signal /CLK.

Figure 13:
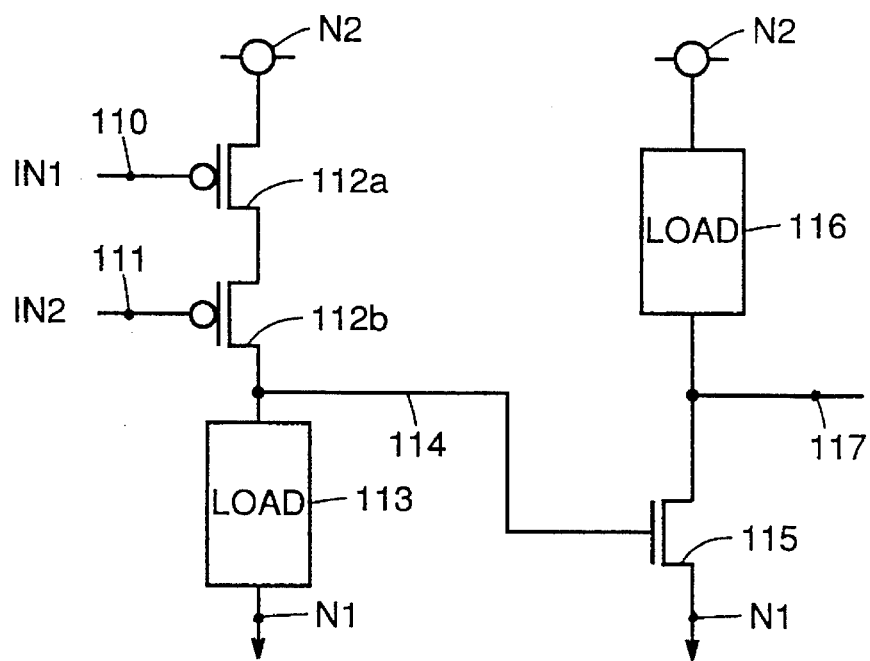

Description will now be given of a seventh example of the logic gate configuring row address decoder 202 of row address processing circuit 2. FIG. 13 is a circuit diagram showing the seventh example of the logic gate of row address decoder 202 used in row address processing circuit 2 of the synchronous SRAM shown in FIG. 1.

In this logic gate, operation for changing an output signal from the H level to the L level is increased in speed.

The logic gate shown in FIG. 13 includes PMOS transistors 112a, 112b, loads 113, 116, and an NMOS transistor 115.

Transistors 112a and 112b and connected in series between second power supply node N2 and a node 114. Transistor 112a receives internal signal IN1 through an input node 110 at its gate. Transistor 112b receives internal signal IN2 through an input node 111 at its gate.

A load 113 is connected between node 114 and first power supply node N1. Load 116 is connected between second power supply node N2 and an output node 117. Transistor 115 is connected between output node 117 and first power supply node N1. Transistor 115 is connected to node 114 at its gate.

Operation of the logic gate shown in FIG. 13 will now be described. When internal signals IN1, IN2 are both at the L level, node 114 attains the H level. On the other hand, when either internal signals IN1 or IN2 is at the H level, node 114 is brought to the L level by load 113.

When the potential of node 114 is at the H level, the potential of output node 117 attains the L level. On the other hand, when the potential of node 114 is at the L level, output node 117 is brought to the H level by load 116.

In this logic gate, the size of transistor 115 is set large. As a result, operation for changing an output signal from the H level to the L level is increased in speed.

Figure 14:
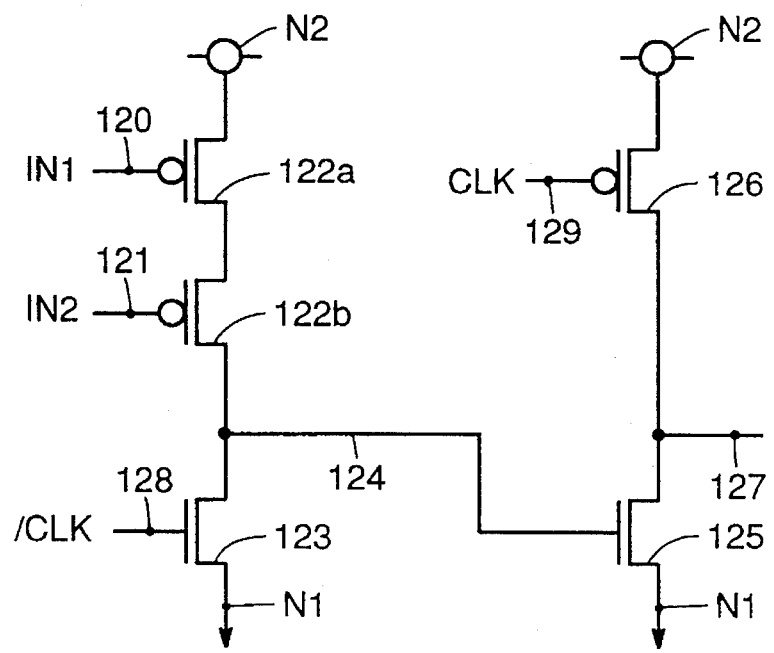

Description will now be given of an eighth example of the logic gate configuring row address decoder 202 of row address processing circuit 2. FIG. 14 is a circuit diagram showing the eighth example of the logic gate of row address decoder 202 used in row address processing circuit 2 of the synchronous SRAM shown in FIG. 1.

In this logic gate, operation for changing an output signal from the H level to the L level is increased in speed.

Referring to FIG. 14, the logic gate includes PMOS transistors 122a, 122b, 126, and NMOS transistors 123, 125. Transistors 112a, 122b, 125, input nodes 120, 121, a node 124, and an output node 127 in FIG. 14 correspond to transistors 112a, 112b, 115, input nodes 110, 111, node 114, and output node 117 in FIG. 13.

The logic gate shown in FIG. 14 is different from that of FIG. 13 in that NMOS transistor 123 is connected between node 124 and first power supply node N1, and that PMOS transistor 126 is connected between output node 127 and second power supply node N2.

Transistor 123 receives inverted synchronous signal /CLK through an input node 128 at its gate. Transistor 126 receives synchronous signal CLK through an input node 129 at its gate.

Operation of the logic gate shown in FIG. 14 will now be described. When synchronous signal CLK is at the H level, a signal is transmitted to a logic gate at the next stage. On the other hand, when synchronous signal CLK is at the L level, node 124 and output node 127 to which a signal is transmitted are both set to the precharge level.

The case where synchronous signal CLK is at the H level will be described in the following. When internal signals IN1, IN2 are both at the L level, the potential of node 124 attains the H level. On the other hand, when either internal signals IN1 or IN2 is at the H level, the potential of node 124 maintains the L level which is the precharge level.

When the potential of node 124 is at the H level, the potential of output node 127 attains the L level. On the other hand, when the potential of node 124 is at the L level, the potential of output node 127 maintains the H level which is the precharge level.

In the logic gate shown in FIG. 14, the size of transistor 125 is set large. As a result, operation for changing an output signal from the H level to the L level is increased in speed. Further, the logic gate operates in synchronism with synchronous signal CLK and inverted synchronous signal /CLK.

Description will now be given of a ninth example of the logic gate configuring row address decoder 202 of row address processing circuit 2. The logic gate uses a feedback signal.

Figure 15:
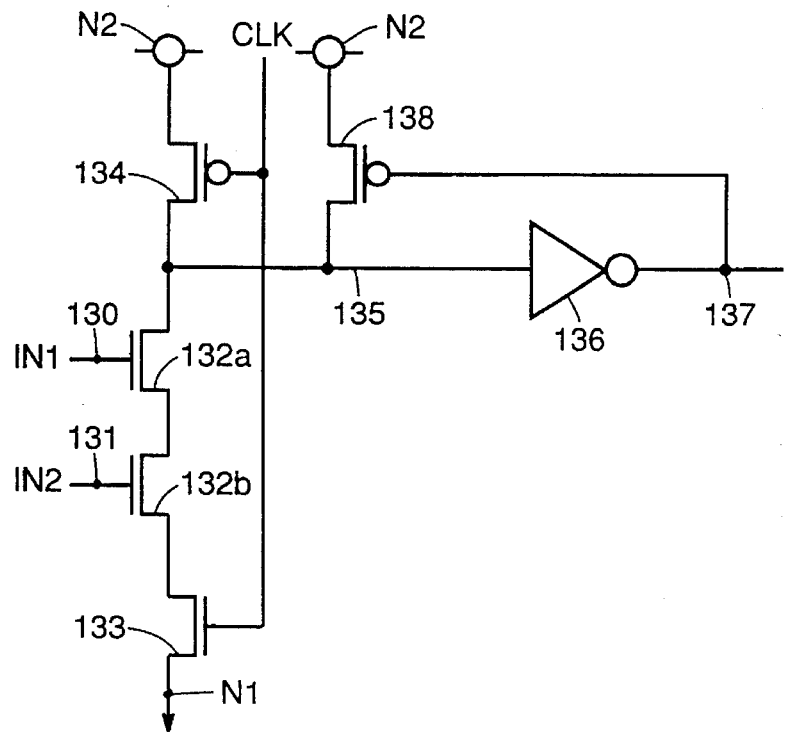

Referring to FIG. 15, the logic gate includes NMOS transistors 132a, 132b, 133, PMOS transistors 134, 138, and an inverter 136.

Transistors 132a, 132b, 133 are connected in series between a node 135 and first power supply node N1. Transistor 132a receives internal signal IN1 through an input node 130 at its gate. Transistor 132b receives internal signal IN2 through an input node 131 at its gate. Transistor 133 receives synchronous signal CLK at its gate.

Transistor 134 is connected between second power supply node N2 and node 135. Transistor 134 receives synchronous signal CLK at its gate. Inverter 136 is connected between node 135 and an output node 137. Transistor 138 is connected between second power supply node N2 and node 135. Transistor 138 is connected to output node 137 at its gate.

In the logic gate shown in FIG. 15, transistors 132a and 132b are set larger in size than the other transistors.

Operation will now be described. When synchronous signal CLK is at the H level, a signal is transmitted to a logic gate at the next stage. On the other hand, when synchronous signal CLK is at the L level, node 135 to which a signal is transmitted is set to the precharge level.

The case where synchronous signal CLK is at the H level will be described in the following. When internal signals IN1, IN2 are both at the H level, the potential of node 135 attains the L level. On the other hand, when either internal signals IN1 or IN2 is at the L level, the potential of node 135 maintains the H level which is the precharge level.

When the potential of node 135 is at the L level, the potential of output node 137 attains the H level. On the other hand, when the potential of node 135 is at the H level, the potential of output node 137 maintains the L level.

When synchronous signal CLK is at the H level, and either internal signals IN1 or IN2 is at the L level, the potential of node 135 is maintained at the H level which is the precharge level by transistor 138. On the other hand, when synchronous signal CLK is at the H level, and internal signals IN1, IN2 are both at the H level, transistor 138 is turned off, causing the potential of node 135 to attain the L level.

Figure 16:
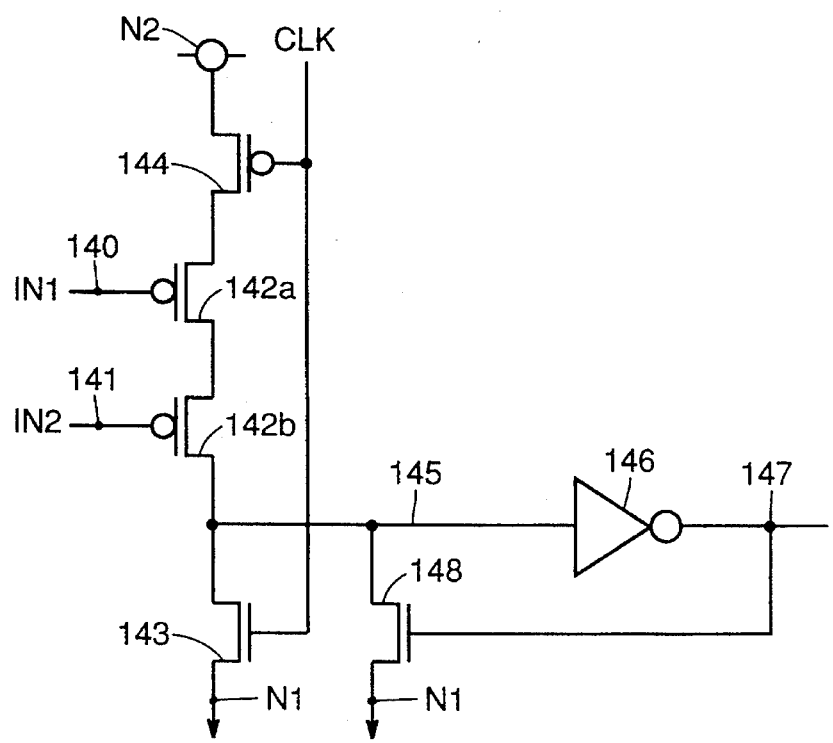

Description will now be given of a tenth example of the logic gate configuring row address decoder 202 of row address processing circuit 2. FIG. 16 is a circuit diagram showing the tenth example of the logic gate of row address decoder 202 used in row address processing circuit 2. Similar to the case of FIG. 15, the logic gate uses a feedback signal.

This logic gate includes PMOS transistors 142a, 142b, 144, NMOS transistors 143, 148, and an inverter 146.

Transistors 144, 142a, 142b are connected in series between second power supply node N2 and node 145. Transistor 142a receives internal signal IN1 through an input node 140 at its gate. Transistor 142b receives internal signal IN2 through an input node 141 at its gate. Transistor 144 receives synchronous signal CLK at its gate.

Transistor 143 is connected between first power supply node N1 and node 145. Transistor 143 receives synchronous signal CLK at its gate. Inverter 146 is connected between node 145 and an output node 147. Transistor 148 is connected between first power supply node N1 and node 145. Transistor 148 is connected to output node 147 at its gate.

In the logic gate shown in FIG. 16, transistors 142a and 142b are set larger in size than the other transistors.

When inverted synchronous signal /CLK is at the L level, a signal is transmitted to a logic gate at the next stage. On the other hand, when inverted synchronous signal /CLK is at the H level, the potential of node 145 to which a signal is transmitted is set to the precharge level.

The case where inverted synchronous signal /CLK is at the H level will be described in the following. When internal signals IN1, IN2 are both at the L level, the potential of node 145 attains the H level. On the other hand, when either internal signals IN1 or IN2 is at the H level, the potential of node 145 maintains the L level which is the precharge level.

When the potential of node 145 is at the H level, the potential of output node 147 attains the L level. On the other hand, when the potential of node 145 is at the L level, the potential of output node 147 maintains the H level.

When inverted synchronous signal /CLK is at the L level, and either internal signals IN1 or IN2 is at the H level, the potential of node 145 is maintained at the L level which is the precharge level by transistor 148. On the other hand, when inverted synchronous signal /CLK is at the L level, and internal signals IN1, IN2 are both at the L level, transistor 148 is turned off, causing the potential of node 145 to attain the H level.

In the logic gate shown in FIG. 16, transistors 142a and 142b are set large in size. Therefore, operation for changing an output signal of node 145 from the L level to the H level is increased in speed.

Figure 17:
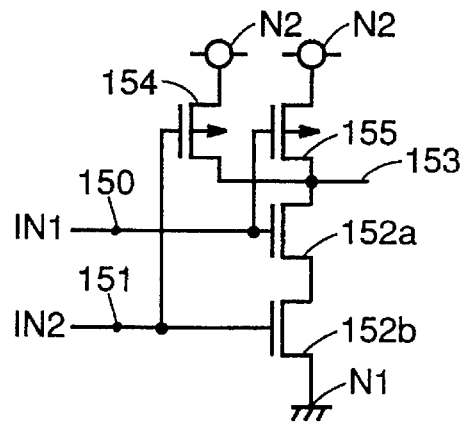

Description will now be given of an eleventh example of the logic gate configuring row address decoder 202 of row address processing circuit 2. FIG. 17 is a circuit diagram showing the eleventh example of the logic gate of row address decoder 202 used in row address processing circuit 2.

The logic gate is an NAND circuit in which high speed operation for changing an output signal from the H level to the L level is achieved. The logic gate shown in FIG. 17 includes NMOS transistors 152a, 152b, and PMOS transistors 154, 155.

Transistors 152a and 152b are connected in series between output node 153 and first power supply node N1. Transistor 152a receives internal signal IN1 through an input node 150 at its gate. Transistor 152b receives internal signal IN2 through an input node 151 at its gate.

Transistors 154 and 155 are connected in parallel between second power supply node N2 and output node 153. Transistor 155 receives internal signal IN1 through input node 150 at its gate. Transistor 154 receives internal signal IN2 through input node 151 at its gate.

In such a logic gate shown in FIG. 17 as described above, transistors 152a and 152b are set sufficiently larger in size than transistors 154 and 155. Therefore, operation for changing an output signal from the H level to the L level is increased in speed.

Figure 18:
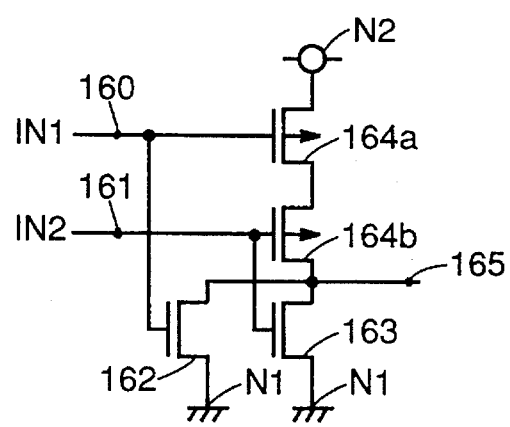

Description will now be given of a twelfth example of the logic gate configuring row address decoder 202 of row address processing circuit 2. FIG. 18 is a circuit diagram showing the twelfth example of the logic gate of row address decoder 202 used in row address processing circuit 2. The logic gate is an NOR circuit in which high speed operation for changing an output signal from the L level to the H level is achieved.

Referring to FIG. 18, the logic gate includes NMOS transistors 162, 163, and PMOS transistors 164a, 164b.

Transistors 164a and 164b are connected in series between second power supply node N2 and an output node 165. Transistor 164a receives internal signal IN1 through an input node 160. Transistor 164b receives internal signal IN2 through an input node 161.

Transistors 162 and 163 are connected in parallel between node 165 and first power supply node N1. Transistor 162 receives internal signal IN1 through input node 160 at its gate. Transistor 163 receives internal signal IN2 through input node 161 at its gate.

In the logic circuit shown in FIG. 18, transistors 164a, 164b are set substantially larger in size than transistors 162, 163. As a result, operation for changing an output signal from the L level to the H level is increased in speed.

Figure 19:
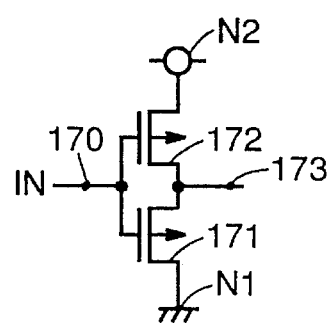

Description will now be given of a thirteenth example of the logic gate configuring row address decoder 202 of row address processing circuit 2. FIG. 19 is circuit diagram showing the thirteenth example of the logic gate of row address decoder 202 used in row address processing circuit 2.

The logic gate is an inverting and amplifying circuit in which high speed operation for changing an output signal from the L level to the H level or high speed operation for changing an output signal from the H level to the L level is achieved.

The logic gate includes an NMOS transistor 171 and a PMOS transistor 172. Transistors 171 and 172 are connected in series between second power supply node N2 and first power supply node N1. Transistors 171 and 172 receive internal signal IN through input node 170 at their gates. A node between transistors 171 and 172 is an output node 173.

In this logic gate, one of transistors 171 and 172 is set sufficiently larger in size than the other transistor. When the size of transistor 171 is set larger than that of transistor 172, operation for changing an output signal from the H level to the L level is increased in speed. On the other hand, when the size of transistor 172 is set sufficiently larger than that of transistor 171, operation for changing an output signal from the L level to the H level is increased in speed.

Figure 20:
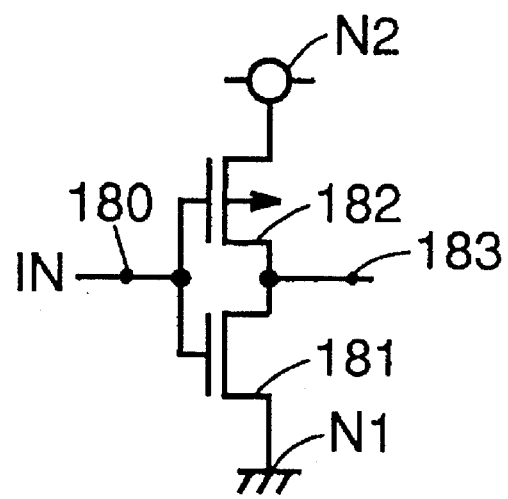

Description will now be given of a fourteenth example of the logic gate configuring row address decoder 202 of row address processing circuit 2. FIG. 20 is a circuit diagram showing the fourteenth example of the logic gate of row address decoder 202 used in row address processing circuit 2.

This logic gate is an inverting and amplifying circuit in which high speed operation for changing an output signal from the H level to the L level and high speed operation for changing an output signal from the L level to the H level are both achieved.

Referring to FIG. 20, the logic gate includes an NMOS transistor 181 and a PMOS transistor 182. Input node 180 and output node 183 in FIG. 20 correspond to input node 170 and output node 173 in FIG. 19.

In this logic gate, when operation for changing an output signal from the H level to the L level is mainly increased in speed, the size of transistor 181 is set sufficiently larger than that of transistor 182. In addition, the threshold voltage of transistor 182 is set large. It should be noted that the absolute value of the threshold voltage is set small.

As a result, operation for changing an output signal from the H level to the L level as well as operation for changing an output signal from the L level to the H level are increased in speed.

On the other hand, when operation for changing an output signal from the L level to the H level is mainly increased in speed, the size of transistor 182 is set sufficiently larger than that of transistor 181. Simultaneously, the threshold voltage of transistor 181 is set small. As a result, operation for changing an output signal from the L level to the H level is increased in speed as well as operation for changing an output signal from the H level to the L level.

Figure 21:
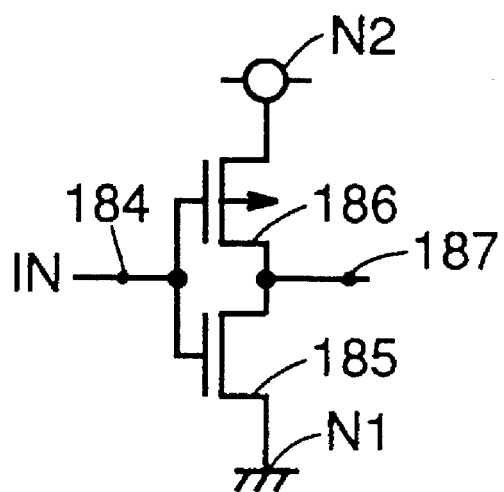

Description will now be given of a fifteenth example of the logic gate configuring row address decoder 202 of row address processing circuit 2. FIG. 21 is a circuit diagram showing the fifteenth example of the logic gate of row address decoder 202 used in row address processing circuit 2. The logic gate is an inverting and amplifying circuit in which operation for changing an output signal from the H level to the L level or operation for changing an output signal from the L level to the H level is further increased in speed than that of FIG. 19.

Referring to FIG. 21, the logic gate includes an NMOS transistor 185 and a PMOS transistor 186. An input node 184 and an output node 187 in FIG. 21 correspond to input node 170 and output node 173 in FIG. 19.

When operation for changing an output signal from the H level to the L level is increased in speed in this logic gate, the size of transistor 185 is set sufficiently larger than that of transistor 186. Simultaneously, the threshold voltage of transistor 185 is set small. As a result, operation for changing an output signal from the H level to the L level is further increased in speed than the case of FIG. 19.

On the other hand, when operation for changing an output signal from the L level to the H level is increased in speed, the size of transistor 186 is set sufficiently larger than that of transistor 185. At the same time, the value of the threshold voltage of transistor 186 is set large. It should be noted that the absolute value of the threshold voltage is set small. As a result, operation for changing an output signal from the L level to the H level is further increased in speed than the case of FIG. 19.

An example will now be given in which the row address buffer (FIGS. 3 and 4) and the logic gate (FIGS. 5, 7, 9 to 21) described in the above embodiments are combined to configure row address processing circuit 2 with reference to FIG. 22, which is a circuit diagram showing the example.

Figure 22:
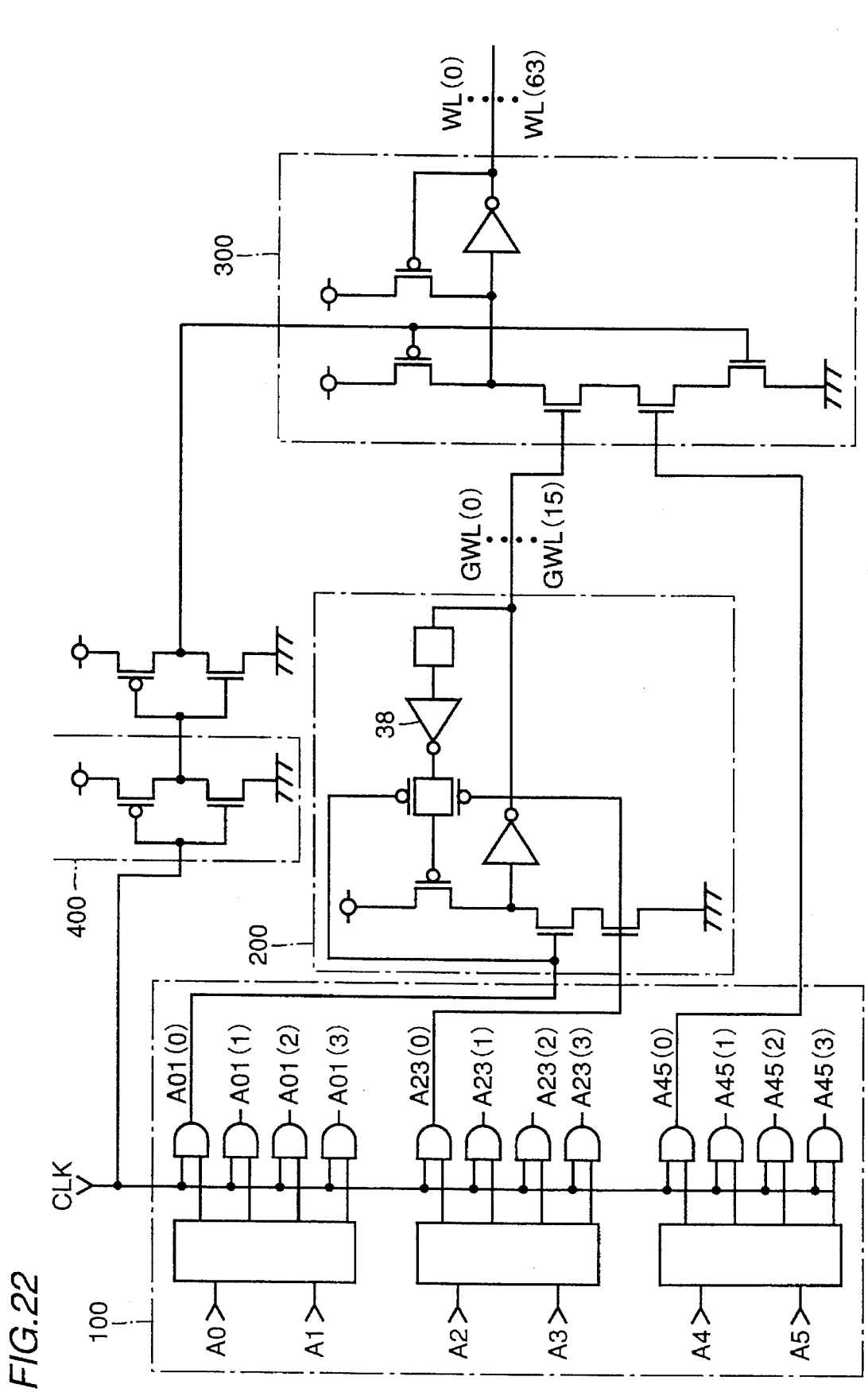
FIG. 22 is a circuit diagram showing one example of a configuration of a row address processing circuit configured of a row address buffer and a logic gate according to one embodiment of the present invention.

In FIG. 22, the row address processing circuit includes a row address buffer (including a predecoder) 100, a global decoder 200, a local decoder 300, and an amplifying circuit 400. In this case, 16 global decoders 200 and 64 local decoders 300 are provided.

For simplicity of description, the case is shown where there are five row address signals A0 to A5. Address signals A01(0)–A01(3) and A23(0)–A23(3) predecoded at row address buffer 100 are decoded at global decoder 200. Global word line select signals GWL(0)–GWL(15) provided from global decoder 200 are applied to local decoder 300.

In response to global word line select signals, address signals A45(0)–A45(3), and a synchronous signal from amplifying circuit 400, local decoder 300 generates word line select signals WL(0)–WL(63).

As row address buffer 100, the row address buffer shown in FIGS. 3 and 4 is used. As global decoder 200, the logic gate shown in FIGS. 5, 7, 9 to 18 is used. As amplifying circuit 400, the logic gate shown in FIGS. 19 to 21 is used. As local decoder 300, the logic gate shown in FIGS. 15 and 16 is used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device from which data can be read out in a non-destructive manner, said semiconductor memory device receiving an external input signal and a synchronous signal and decoding said external input signal in synchronism with said synchronous signal, comprising:

input processing means for processing said external input signal in synchronism with said synchronous signal, said input processing means including:

buffer means for amplifying and inverting and amplifying said external input signal for output, and decoding means for decoding an output signal from said buffer means, wherein said buffer means or said decoding means generates an output signal in synchronism with said synchronous signal.

2. A semiconductor memory device receiving an external input signal and a synchronous signal and decoding said external input signal in synchronism with said synchronous signal, comprising:

an array of memory cells activated by a plurality of internal nodes;

phase inverted signal generating means receiving said external input signal for providing a first signal obtained by amplifying the external input signal and a second signal obtained by inverting and amplifying the external input signal;

predecode means, receiving at least one of said first signal and said second signal as an output signal from said phase inverted signal generating means, for predecoding the output signal for output;

a logic gate for taking a logical product of the output signal from said phase inverted signal generating means or an output signal from said predecode means, and said synchronous signal, and for providing the resultant signal as an output signal from said phase inverted signal generating means or said predecode means; and means for amplifying the output signal of said logic gate and using said the amplified output signal for activation of said plurality of internal nodes.

3. A semiconductor memory device receiving an external input signal and a synchronous signal and decoding said external input signal in synchronism with said synchronous signal, comprising:

logic gate means provided for decoding said external input signal for taking a logical sum or a logical product of a plurality of internal signals obtained in response to said external input signal and for generating the resultant output signal, said logic gate means including:

a signal generating node for generating said output signal, transistor means receiving said plurality of internal signals for controlling said signal generating node to attain a first potential in response to the internal signals, precharge signal generating means responsive to said signal generating node attaining said first potential for generating a precharge signal, gate means receiving said plurality of internal signals and said precharge signal and responsive to the internal signals for providing the precharge signal when said transistor means does not control said signal generating node to attain said first potential, and potential control means responsive to the precharge signal provided from said gate means for controlling said signal generating node to attain a second potential.

4. The semiconductor memory device as recited in claim 3, further comprising:

a power supply node receiving said first potential, wherein said transistor means includes:

a plurality of MOS transistors of the same conductivity type connected in series between said signal generating node and said power supply node, and each having a gate receiving one of said plurality of internal signals.

5. The semiconductor memory device as recited in claim 3, wherein said precharge signal generating means includes delay means for delaying output of said precharge signal.

6. A semiconductor memory device receiving an external input signal and a synchronous signal and decoding said external input signal in synchronism with said synchronous signal, comprising:

logic gate means provided for decoding said external input signal for taking a logical sum or a logical product of a plurality of internal signals obtained in response to said external input signal and generating the resultant output signal, said logic gate means including:

a signal generating node for generating a control signal, first transistor means receiving said plurality of internal signals and responsive to the internal signals for controlling said signal generating node to attain a first level, first potential supply means for bringing a potential of said signal generating node to a second level when said signal generating node is not controlled to attain said first level, an output node through which said output signal is provided, second transistor means receiving the control signal from said signal generating node and responsive to the control signal for controlling a potential of said output node to attain said second level, and second potential supply means for bringing the potential of said output node to said first level when said output node is not controlled to attain said second level.

7. The semiconductor memory device as recited in claim 6, further comprising:

a first power supply node receiving the potential of said first level, wherein said first transistor means includes:

a plurality of MOS transistors of the same conductivity type connected between said signal generating node and said first power supply node, and each having a gate receiving one of said plurality of internal signals.

8. The semiconductor memory device as recited in claim 7, further comprising:

a second power supply node receiving the potential of said second level, wherein said second transistor means includes:

a second MOS transistor having a gate receiving said control signal, and provided between said output node and said second power supply node.

9. The semiconductor memory device as recited in claim 8, further comprising:

a third MOS transistor having a gate receiving one of said plurality of internal signals, and connected between said second MOS transistor and said second power supply node.

10. A semiconductor memory device receiving an external input signal and a synchronous signal and decoding said external input signal in synchronism with said synchronous signal, comprising:

logic gate means provided for decoding said external input signal for taking a logical sum or a logical product of a plurality of internal signals obtained in response to said external input signal and generating the resultant output signal, said logic gate means including:

a signal generating node for generating a control signal, first transistor means receiving said plurality of internal signals and responsive to the internal signals for controlling a potential of said signal generating node to attain a first level, first potential supply means receiving said synchronous signal and responsive to the synchronous signal for bringing the potential of said signal generating node to a second level when said signal generating node is not controlled to attain said first level, an output node through which said output signal is provided, second transistor means receiving the control signal from said signal generating node and responsive to the control signal for controlling a potential of said output node to attain said second level, and second potential supply means receiving said synchronous signal, and, in synchronism with the synchronous signal, for bringing the potential of said output node to said first level when said output node is not controlled to attain said second level.

11. The semiconductor memory device as recited in claim 10, further comprising:

a first power supply node receiving a potential at said first level, wherein said first transistor means includes:

a plurality of MOS transistors of the same conductivity type connected in series between said signal generating node and said first power supply node and each having a gate receiving one of said plurality of internal signals.

12. The semiconductor memory device as recited in claim 11, further comprising:
a second power supply node receiving a potential at said second level, wherein
said second transistor means includes:
a second MOS transistor having a gate receiving said control signal, and provided between said output node and said second power supply node.

13. The semiconductor memory device as recited in claim 12, further comprising:
a third MOS transistor having a gate receiving one of said plurality of internal signals, and connected between said second MOS transistor and said second power supply node.

14. A semiconductor memory device receiving an external input signal and a synchronous signal and decoding said external input signal in synchronism with said synchronous signal, comprising:
logic gate means provided for decoding said external input signal for taking a logical sum or a logical product of a plurality of internal signals obtained in response to said external input signal and generating the resultant output signal,
said logic gate means including:
first transistor means receiving said plurality of internal signals and responsive to the signals for bringing said output signal to a first level, and
second transistor means receiving said plurality of internal signals and responsive to the signals for bringing said output signal to a second level, wherein
an input capacity of one of said first and second transistor means is set larger than that of the other transistor.

15. The semiconductor memory device as recited in claim 14, wherein
a threshold voltage of transistor means having a larger input capacity between said first and second transistor means is set smaller than that of transistor means having a smaller input capacity.

16. The semiconductor memory device as recited in claim 14, further comprising:
a first power supply node receiving a potential at said first level;
a second power supply node receiving a potential at said second level; and
an output node through which an output signal from said logic gate means is provided, wherein
said first transistor means includes:
a plurality of first MOS transistors of a first conductivity type connected in series between said first power supply node and said output node, and each having a gate receiving one of said plurality of internal signals, and
said second transistor means includes:
a plurality of second MOS transistors of a second conductivity type connected in parallel between said first power supply node and said output node, and each having a gate receiving one of said plurality of internal signals.

17. A semiconductor memory device receiving an external input signal and a synchronous signal and decoding said external input signal in synchronism with said synchronous signal, comprising:
logic gate means provided for decoding said external input signal for taking a logical sum or a logical product of a plurality of internal signals obtained in response to said external input signal and generating the resultant output signal,
said logic gate means including:
a signal generating node for generating said output signal,
transistor means receiving said plurality of internal signals and responsive to the internal signals for controlling said signal generating node to attain a potential of a first level,
first potential supply means receiving said synchronous signal and responsive to the synchronous signal for supplying the potential of said first level to said transistor means when the potential of said signal generating node is controlled to attain said first level,
second potential supply means receiving said synchronous signal and responsive to the synchronous signal for supplying a potential of a second level to said signal generating node when the potential of said signal generating node is not controlled to attain said first level,
inverting and output means for inverting the signal generated by said signal generating node for output, and
precharge means responsive to a signal provided from said inverting and output means for precharging said signal generating node to a potential of said second level.

18. The semiconductor memory device as recited in claim 17, further comprising:
a power supply node receiving the potential of said first level, wherein
said transistor means includes:
a plurality of MOS transistors of the same conductivity type connected in series between said signal generating node and said power supply node, and each having a gate receiving one of said plurality of internal signals.

19. A semiconductor memory device receiving an external input signal and a synchronous signal and decoding said external input signal in synchronism with said synchronous signal, comprising:
logic gate means provided for decoding said external input signal for inverting an internal signal obtained in response to said external input signal and generating the resultant output signal,
said logic gate means including:
a first transistor receiving said internal signal and responsive to the internal signal for controlling said output signal to attain a potential of a first level, and
a second transistor receiving said internal signal and responsive to the internal signal for controlling said output signal to attain a potential of a second level, wherein
an input capacity of one of said first and second transistors is set larger than that of the other transistor.

20. The semiconductor memory device as recited in claim 19, wherein
a threshold voltage of a transistor having a larger input capacity between said first and second transistors is set larger than that of a transistor having a smaller input capacity.

21. A semiconductor memory device as recited in claim 2, wherein said plurality of internal nodes comprises a plurality of word lines and wherein said semiconductor memory device further comprises:

a decoding circuit providing a decoded output signal, said logic gate being a part of said decoding circuit; and a word line drive circuit receiving the decoded output signal from said decoding circuit as an input and activating said plurality of word lines in accordance with said decoded output signal from said decoding circuit.

22. A semiconductor memory device as recited in claim 2, wherein said semiconductor memory device further comprises:

a column address decoding circuit providing a decoded column address output signal, said logic gate being a part of said decoding circuit; and a column address processing circuit receiving the decoded output signal from said column address decoding circuit as an input and activating said plurality of internal nodes in accordance with said decoded output signal from said column address decoding circuit.

23. A semiconductor memory device from which data can be read out in a non-destructive manner, said semiconductor memory device receiving an external input signal and a synchronous signal and decoding said external input signal in synchronism with said synchronous signal, comprising:

input processing means for processing said external input signal in synchronism with said synchronous signal, said input processing means including:

buffer means for amplifying and inverting and amplifying said external input signal for output, and decoding means for decoding an output signal from said buffer means, wherein said decoding means provides a signal in response to said synchronous signal.

\* \* \* \* \*